(12) United States Patent
Nakaki

(10) Patent No.: US 9,530,697 B1
(45) Date of Patent: Dec. 27, 2016

(54) SEMICONDUCTOR MEMORY DEVICE AND METHOD FOR MANUFACTURING SAME

(71) Applicant: Kabushiki Kaisha Toshiba, Minato-ku (JP)

(72) Inventor: Hiroshi Nakaki, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/050,711

(22) Filed: Feb. 23, 2016

Related U.S. Application Data

(60) Provisional application No. 62/215,973, filed on Sep. 9, 2015.

(51) Int. Cl.
| | | |
|---|---|---|
| H01L 21/336 | (2006.01) | |
| H01L 29/66 | (2006.01) | |
| H01L 21/8234 | (2006.01) | |
| H01L 23/535 | (2006.01) | |
| H01L 27/115 | (2006.01) | |

(52) U.S. Cl.
CPC ..... *H01L 21/823487* (2013.01); *H01L 23/535* (2013.01); *H01L 27/11553* (2013.01)

(58) Field of Classification Search
CPC .............................................. H01L 21/823487
USPC .......................... 438/212, 268; 257/135, 329
See application file for complete search history.

(56) References Cited

U.S. PATENT DOCUMENTS

| | | | | |
|---|---|---|---|---|
| 7,821,058 B2 * | 10/2010 | Kidoh | ............... | H01L 27/11568 257/324 |
| 7,936,004 B2 | 5/2011 | Kito et al. | | |
| 8,551,838 B2 | 10/2013 | Kito et al. | | |
| 9,064,735 B2 | 6/2015 | Kito et al. | | |

FOREIGN PATENT DOCUMENTS

JP          2006-86674          3/2006

* cited by examiner

*Primary Examiner* — Calvin Lee
(74) *Attorney, Agent, or Firm* — Oblon, McClelland, Maier & Neustadt, L.L.P.

(57) ABSTRACT

According to one embodiment, a semiconductor memory device includes a substrate, a stacked body, a semiconductor film, a memory film, an interconnect portion, and first and second insulating films. The first and second insulating films are provided on the interconnect portion. The interconnect portion includes first and second interconnect portions. The first interconnect portion is provided on the substrate. A width of a cross-section of the second interconnect portion decreases with increased distance from the substrate. The first insulating film is provided on side surfaces of the first and second interconnect portions. The second insulating film includes first to third portions. The first portion is provided on an upper surface of the interconnect portion. The first insulating film is provided between the second portion and the side surface of the second interconnect portion. The third portion extends in a second direction crossing the stacking direction and the first direction.

14 Claims, 28 Drawing Sheets

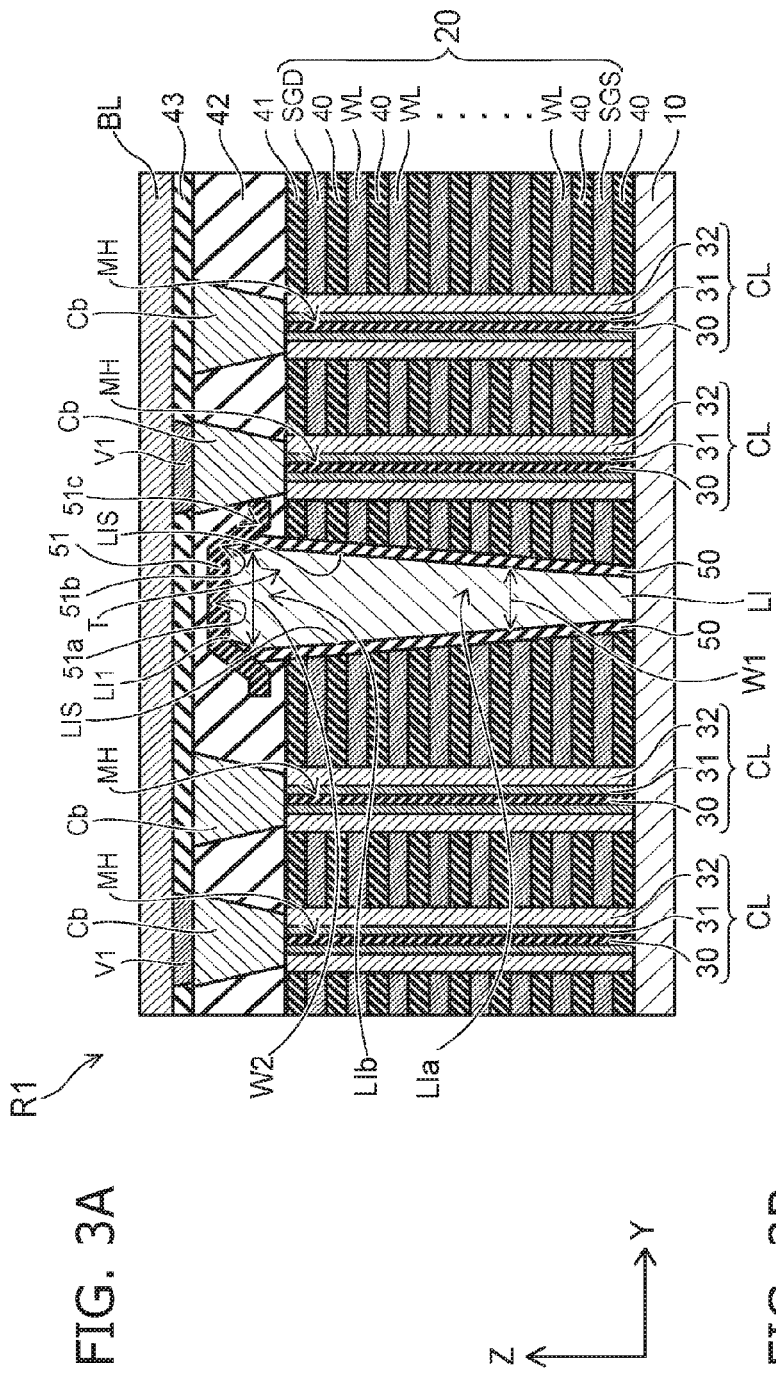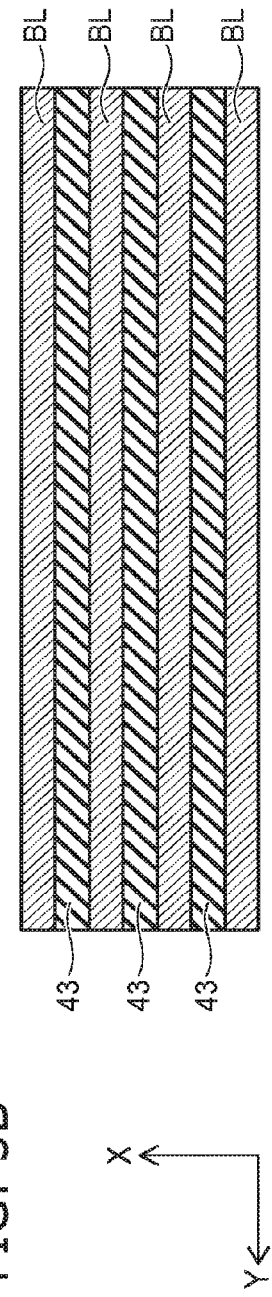
FIG. 3A
FIG. 3B

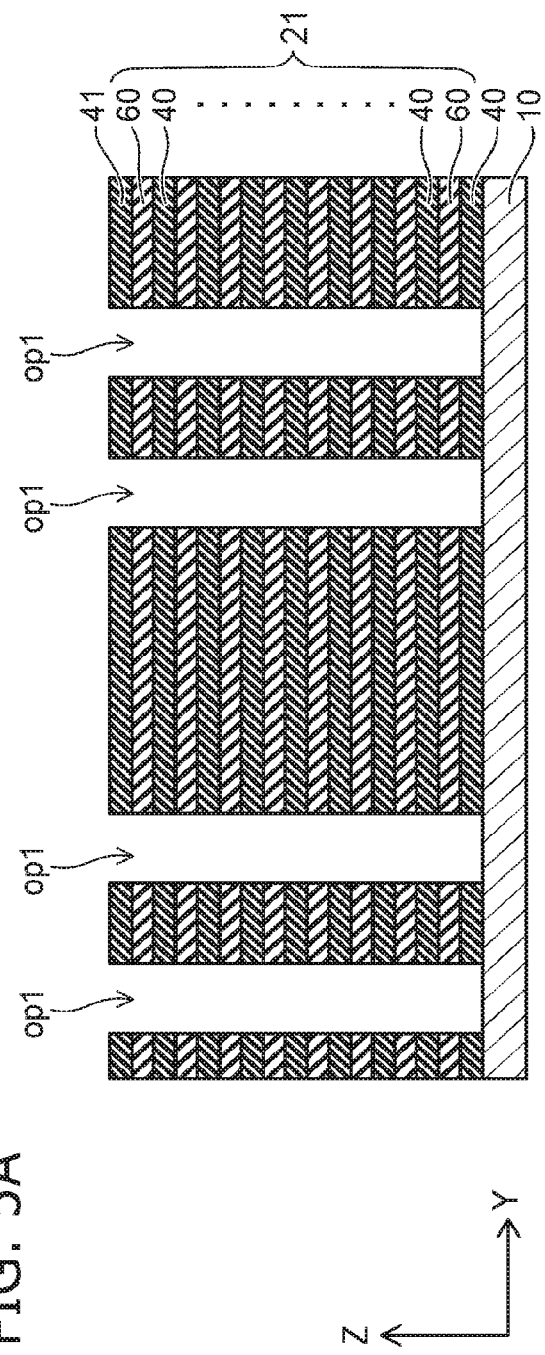
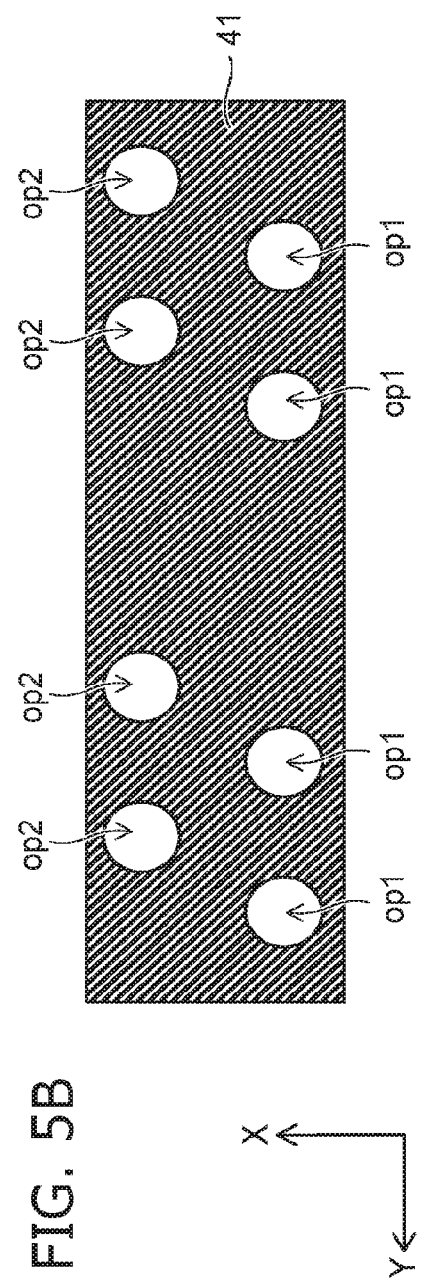

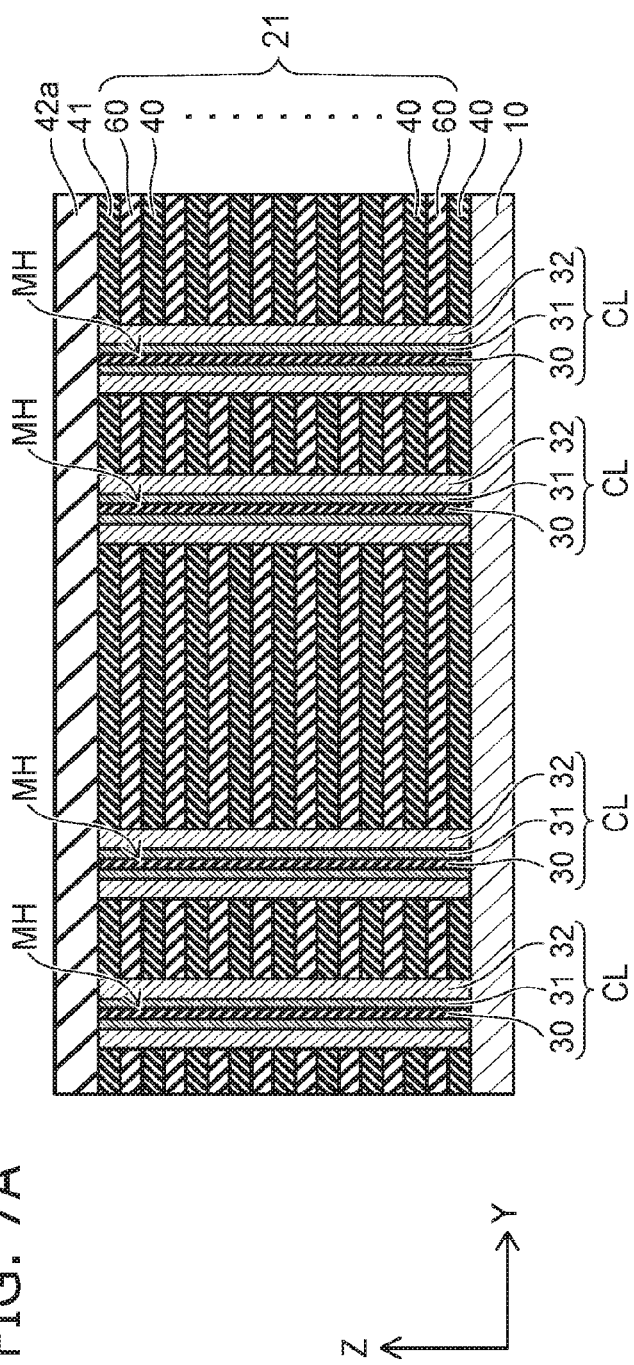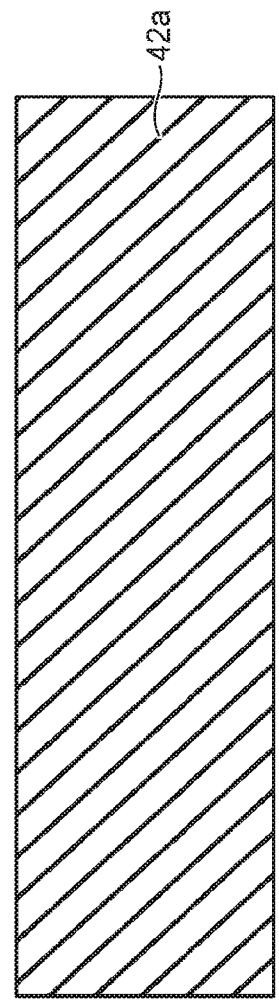
FIG. 7A
FIG. 7B

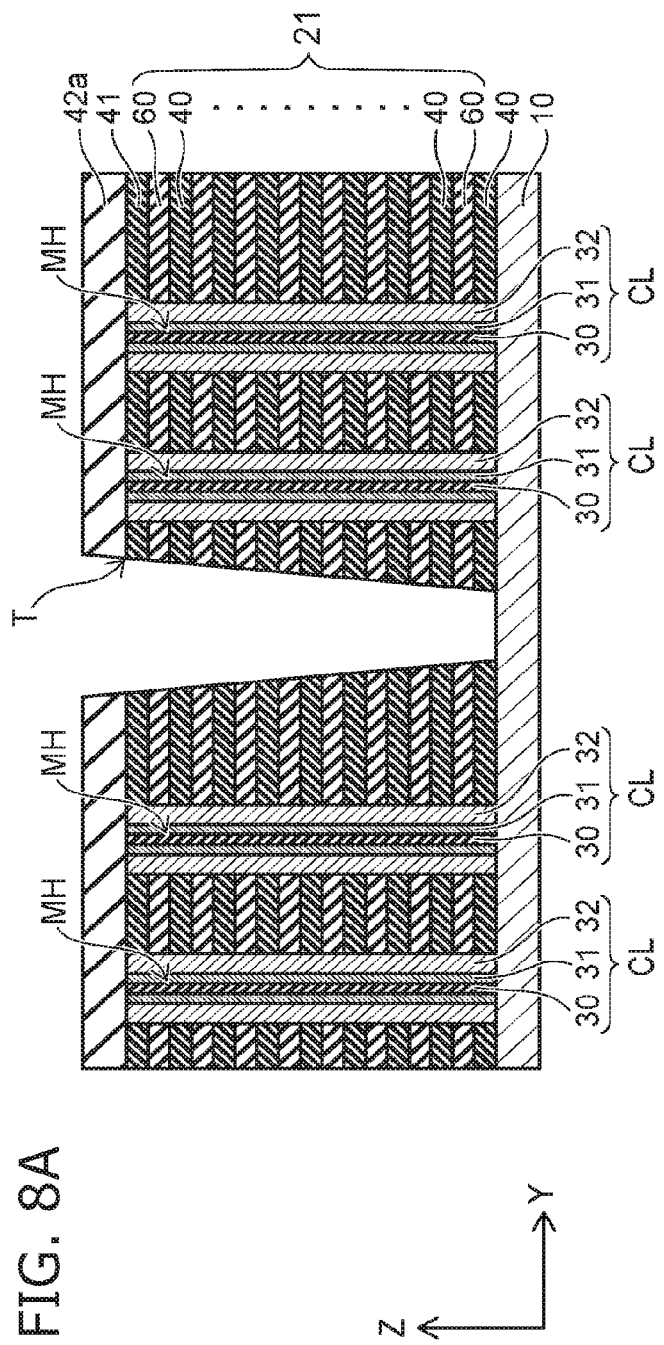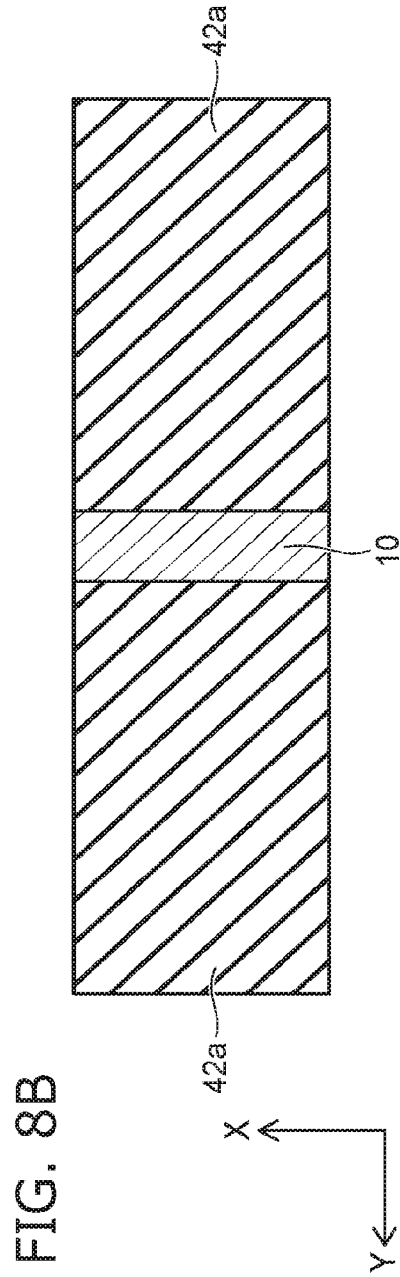

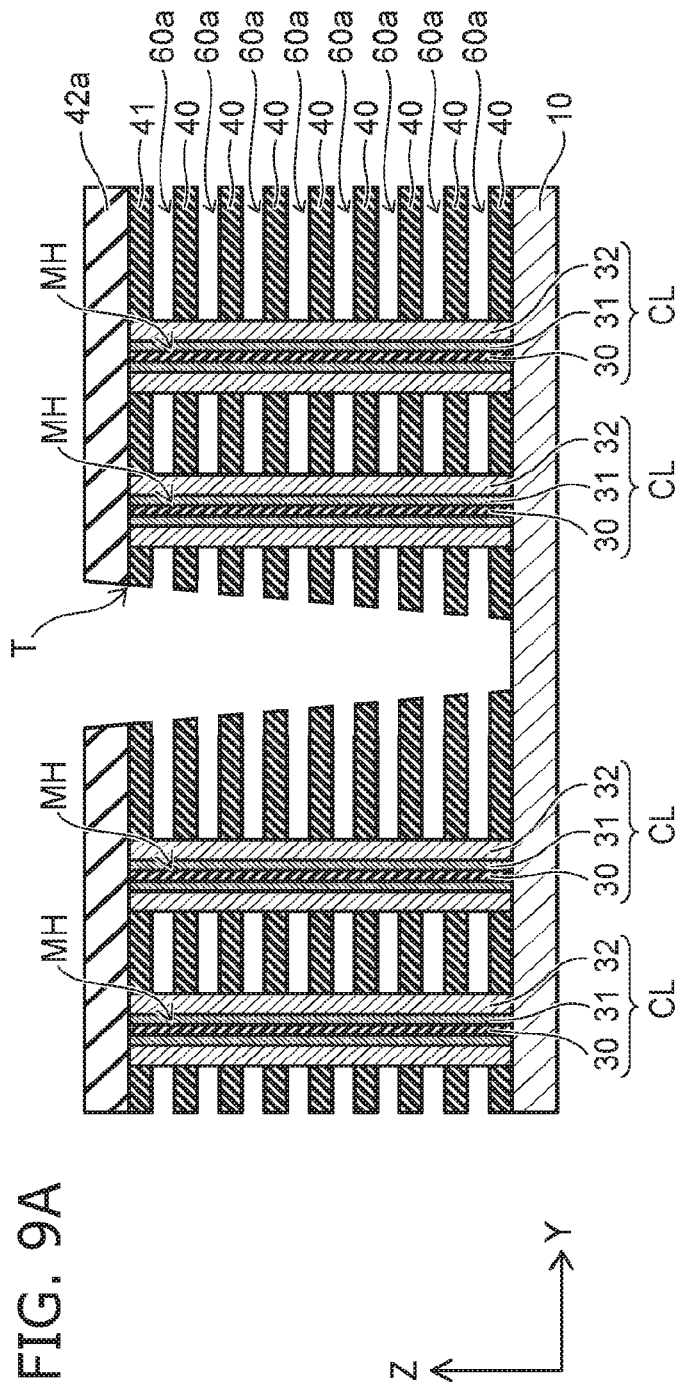
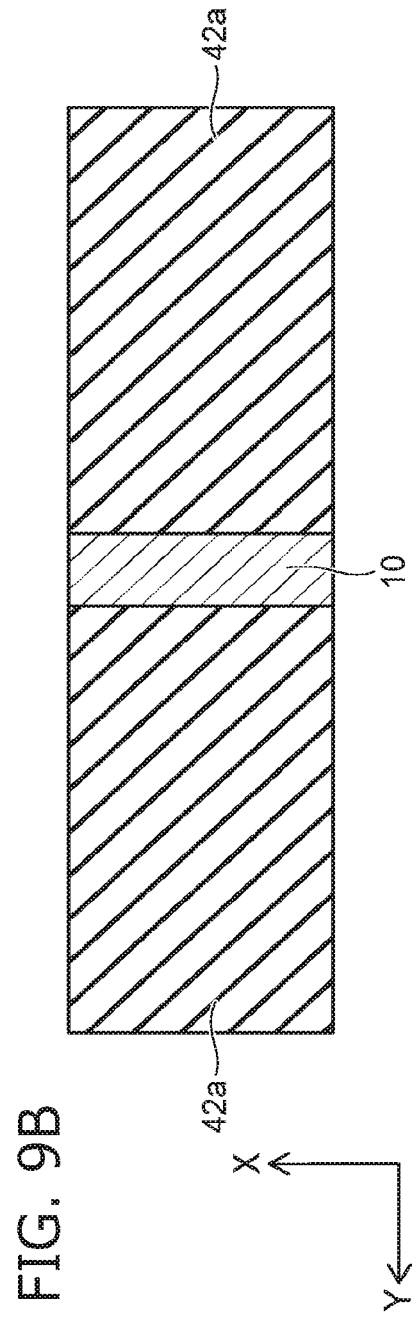

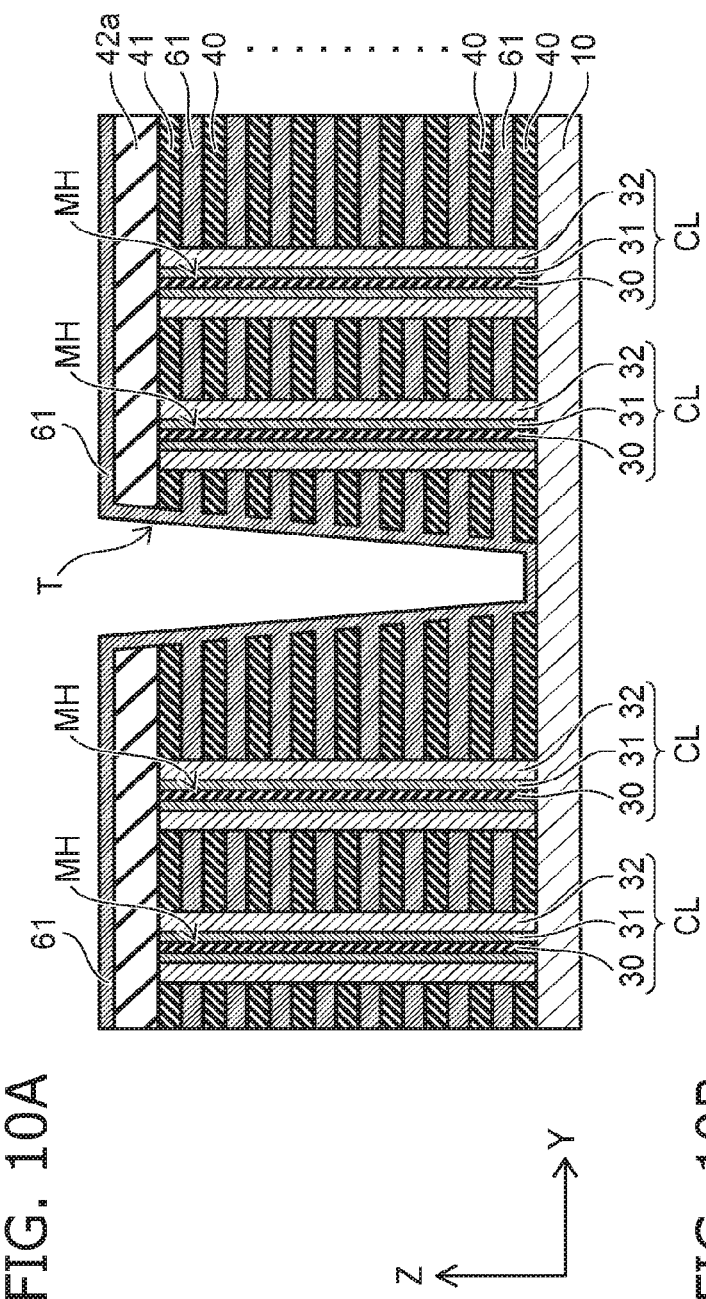
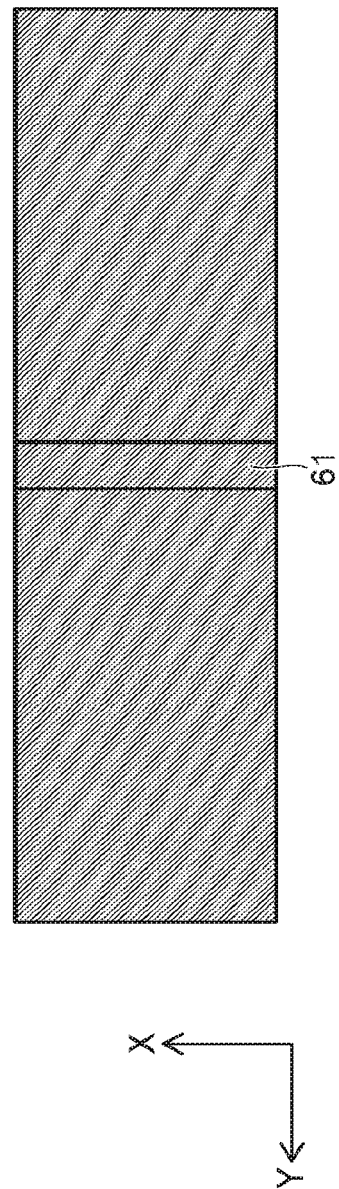
FIG. 10A
FIG. 10B

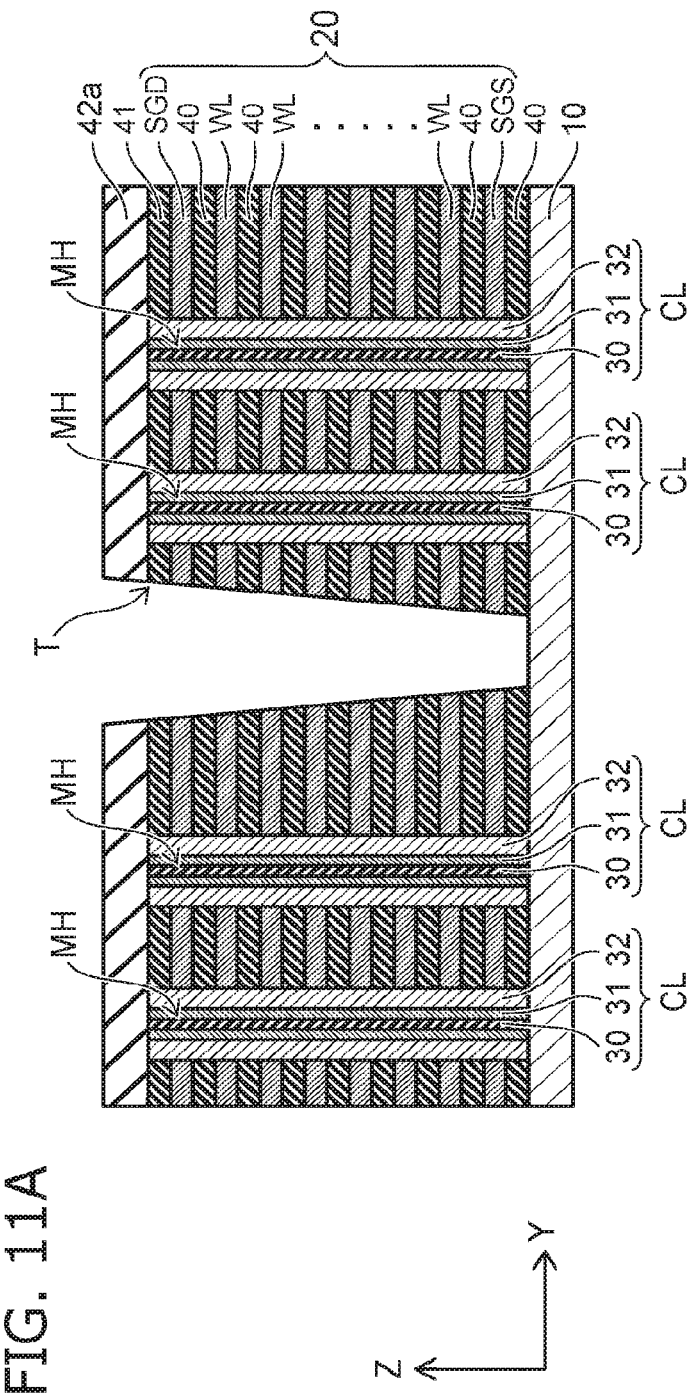
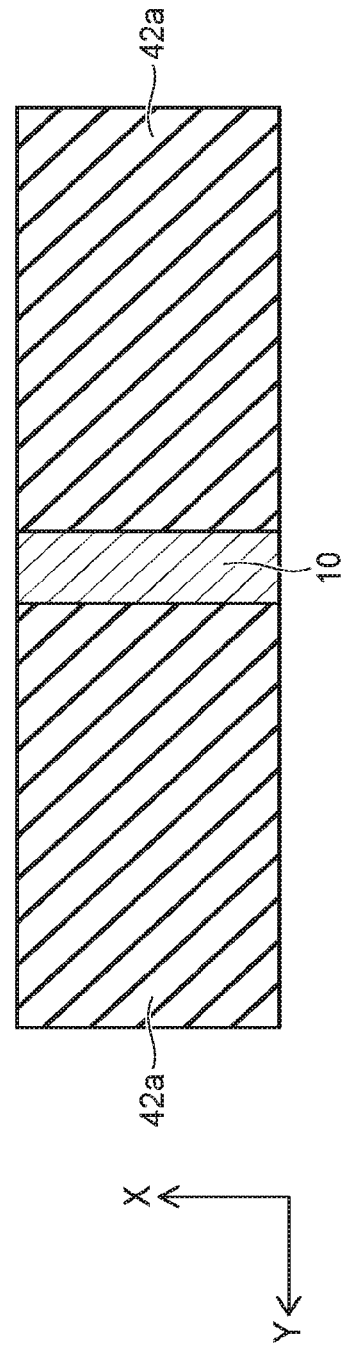
FIG. 11A
FIG. 11B

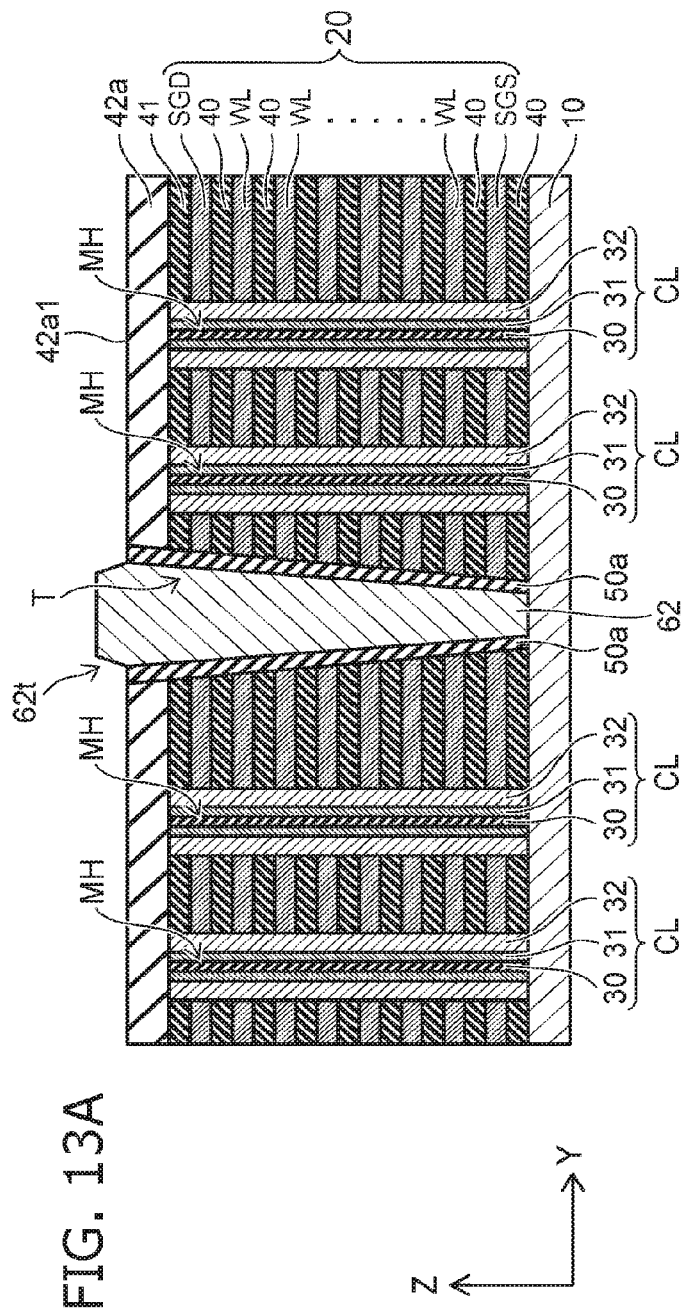
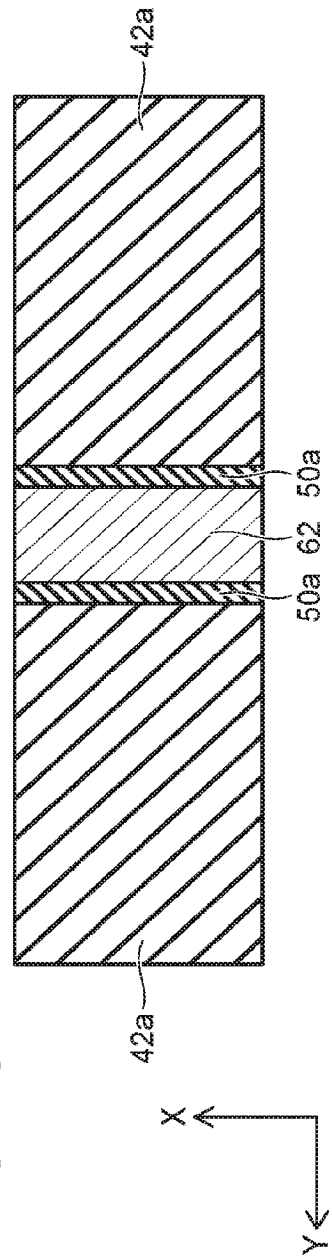
FIG. 13A
FIG. 13B

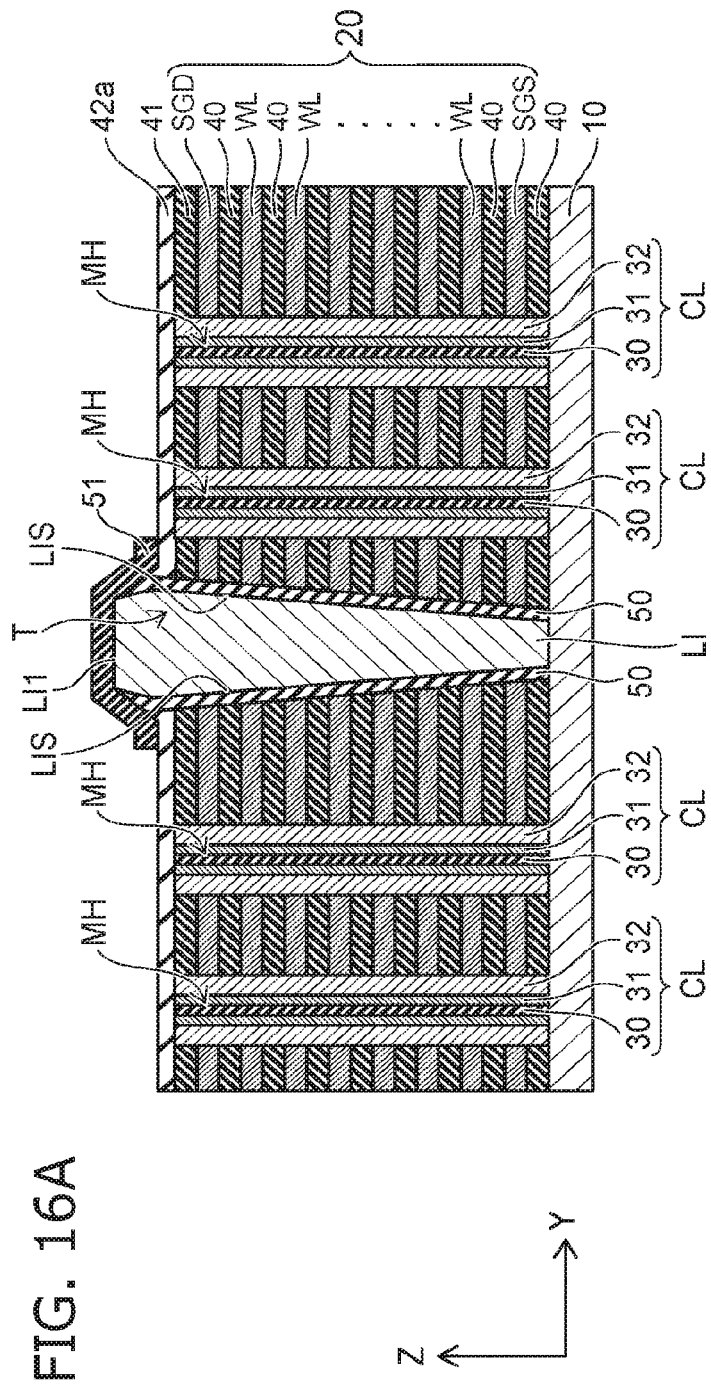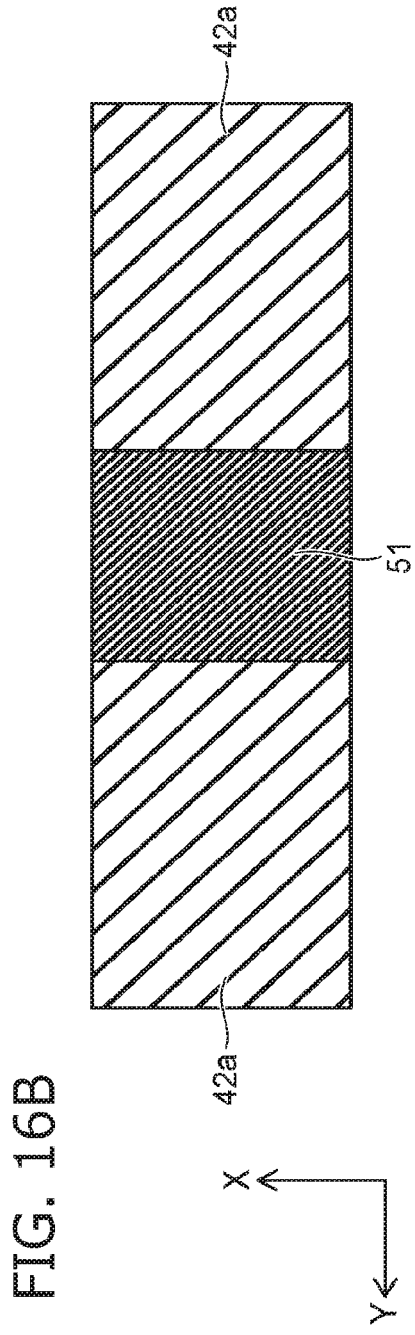

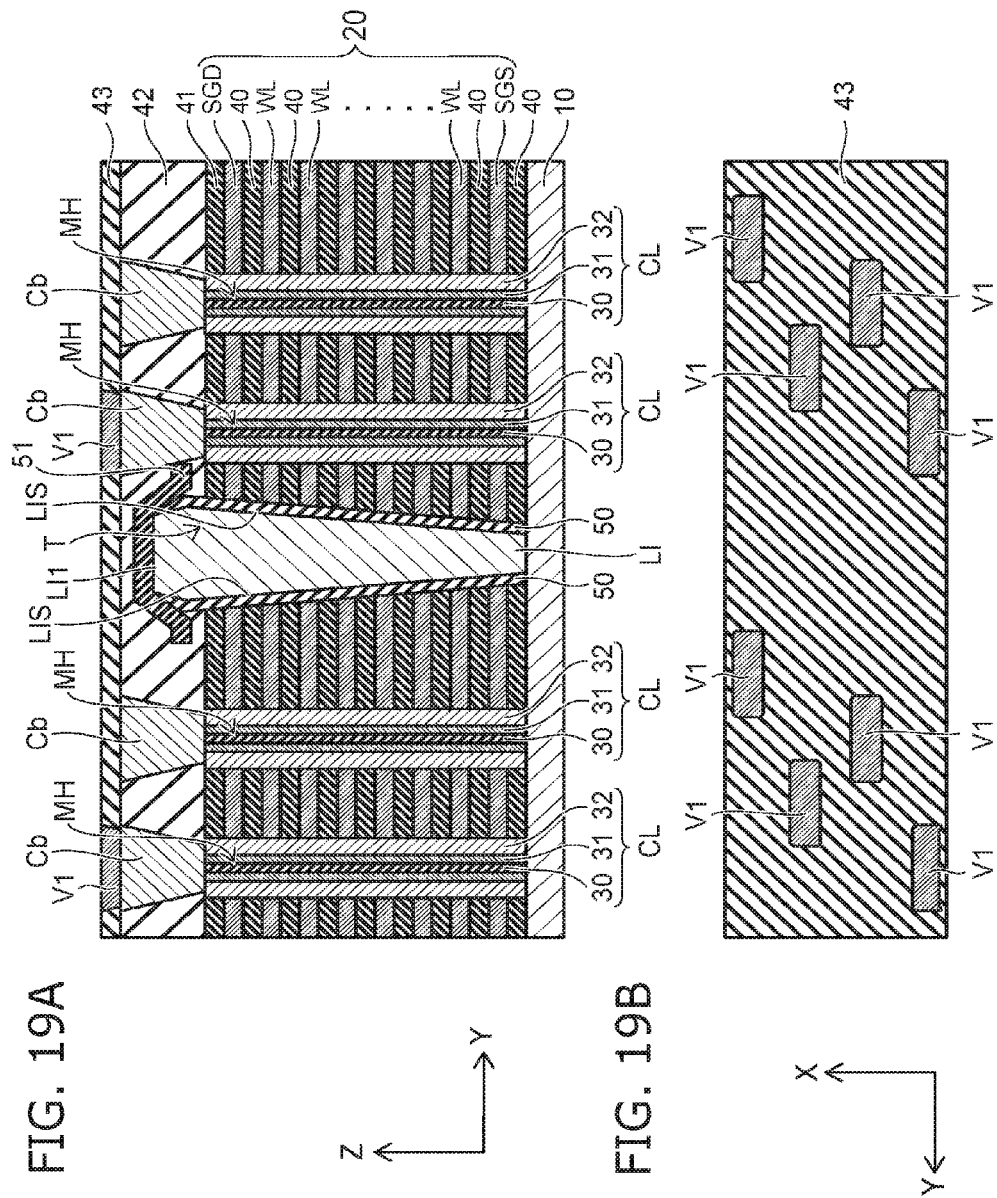

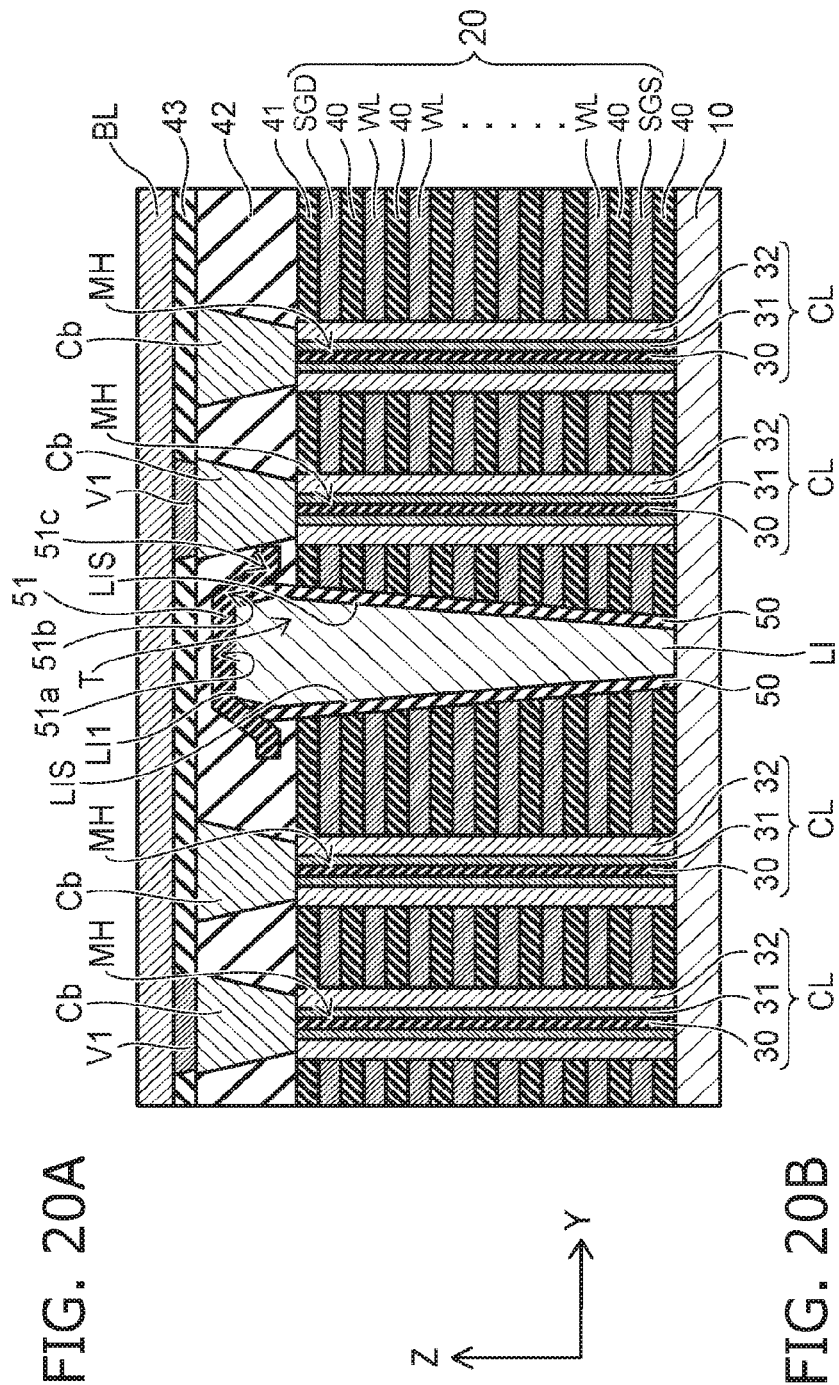
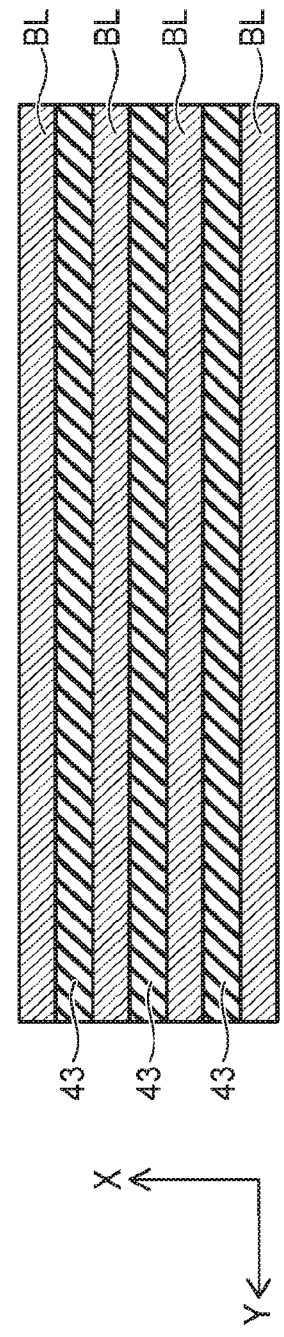
FIG. 20A
FIG. 20B

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/215,973, filed on Sep. 9, 2015; the entire contents of which are incorporated herein by reference.

FIELD

Embodiments described herein relate generally to a semiconductor memory device and a method for manufacturing same.

BACKGROUND

A memory device having a three-dimensional structure has been proposed, in which memory holes are formed in a stacked body including a plurality of electrode layers that functions as control gates in memory cells and is separately stacked each other, and a silicon body serving as a channel is provided on a side wall of the memory hole with a charge storage film between the side wall and the silicon body. In such a three-dimensional device, one fear is a short circuit between interconnects due to position shift of a contact provided around the memory hole.

BRIEF DESCRIPTION OF THE DRAWINGS

FIG. 3A to FIG. 3D are schematic views of portions of the semiconductor memory device according to the first embodiment;

FIG. 4A and FIG. 4B to FIG. 16A and FIG. 16B show a method for manufacturing the semiconductor memory device according to the first embodiment;

FIG. 17A to FIG. 17D to FIG. 20A to FIG. 20D show a method for manufacturing the semiconductor memory device according to the first embodiment;

DETAILED DESCRIPTION

According to one embodiment, a semiconductor memory device includes a substrate, a stacked body, a semiconductor film, a memory film, an interconnect portion, a first insulating film, and a second insulating film. The stacked body is provided on the substrate. The stacked body includes a plurality of electrode layers. The plurality of electrode layers is stacked separately from each other. The semiconductor film extends in a stacking direction in the stacked body. The memory film is provided between the semiconductor film and one of the plurality of electrode layers. The interconnect portion is provided in the stacked body. The interconnect portion has a plate shape and extends in the stacking direction and a first direction crossing the stacking direction. The first insulating film and the second insulating film are provided on the interconnect portion. The interconnect portion includes a first interconnect portion and a second interconnect portion. The first interconnect portion is provided on the substrate. A width of a cross-section of the second interconnect portion decreases with increased distance from the substrate. The first insulating film is provided on a side surface of the first interconnect portion and a side surface of the second interconnect portion. The second insulating film includes a first portion, a second portion, and a third portion. The first portion is provided on an upper surface of the interconnect portion. The first insulating film is provided between the second portion and the side surface of the second interconnect portion. The third portion extends in a second direction crossing the stacking direction and the first direction.

Hereinafter, a semiconductor memory device having a three-dimensional structure will be described by way of example.

First Embodiment

Figure 1:
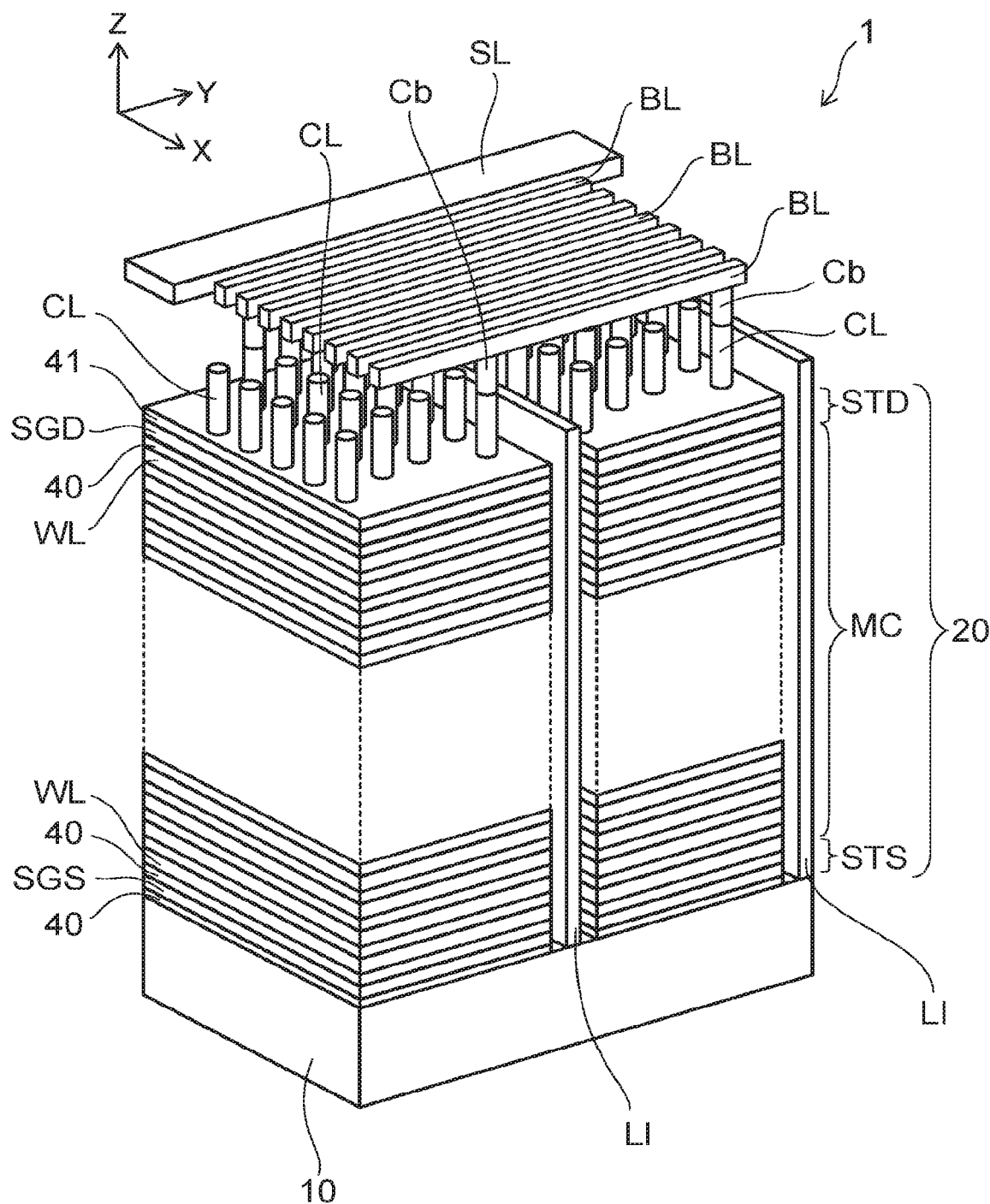
FIG. 1 is a schematic perspective view showing a semiconductor memory device according to a first embodiment.

FIG. 1 is a schematic perspective view showing a semiconductor memory device according to a first embodiment.

Figure 2:
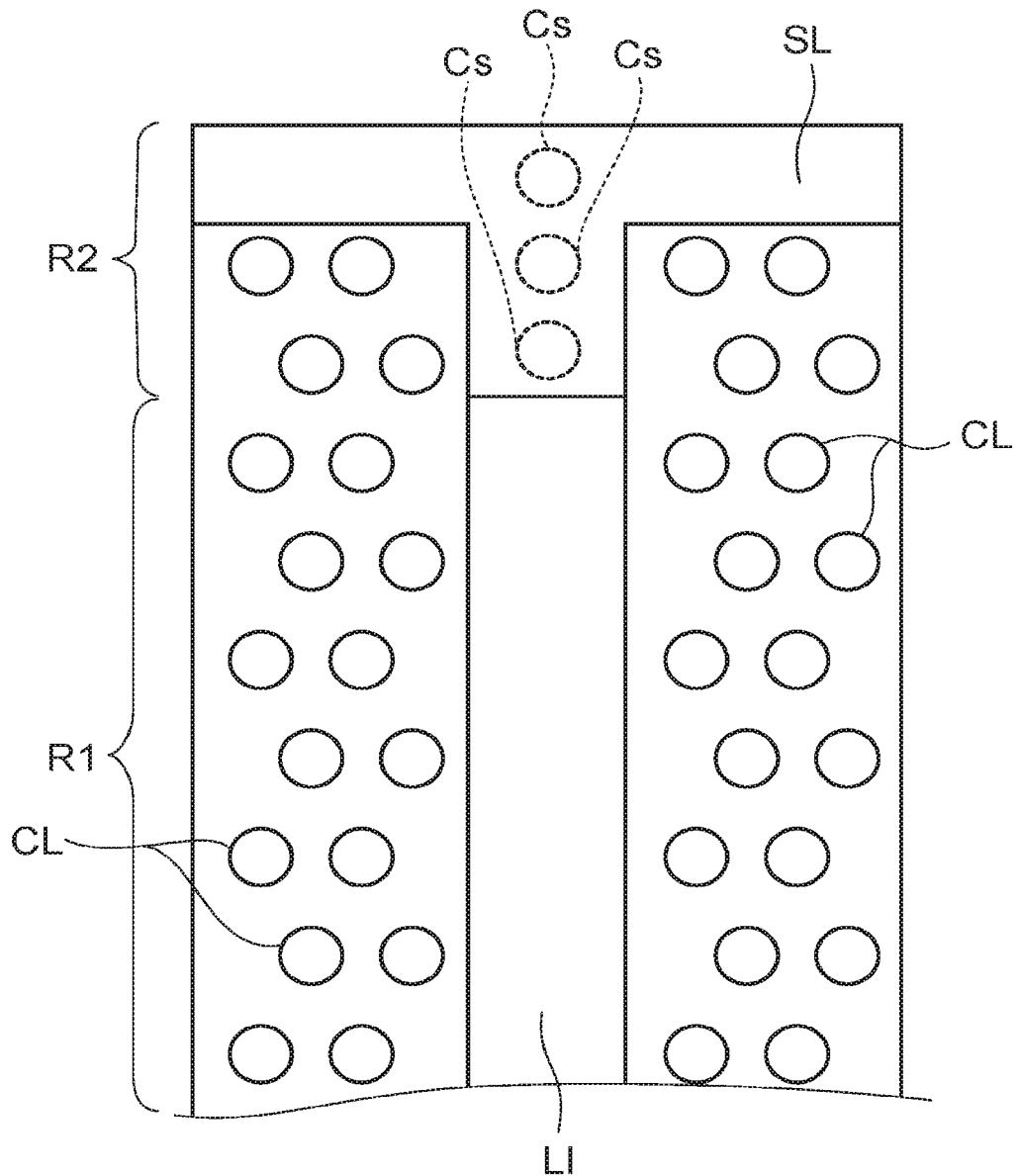
FIG. 2 is a schematic view of a portion of the semiconductor memory device according to the first embodiment.

FIG. 2 is a schematic view of a portion of the semiconductor memory device according to the first embodiment.

FIG. 3A to FIG. 3D are schematic views of portions of the semiconductor memory device according to the first embodiment.

Figure 3C:
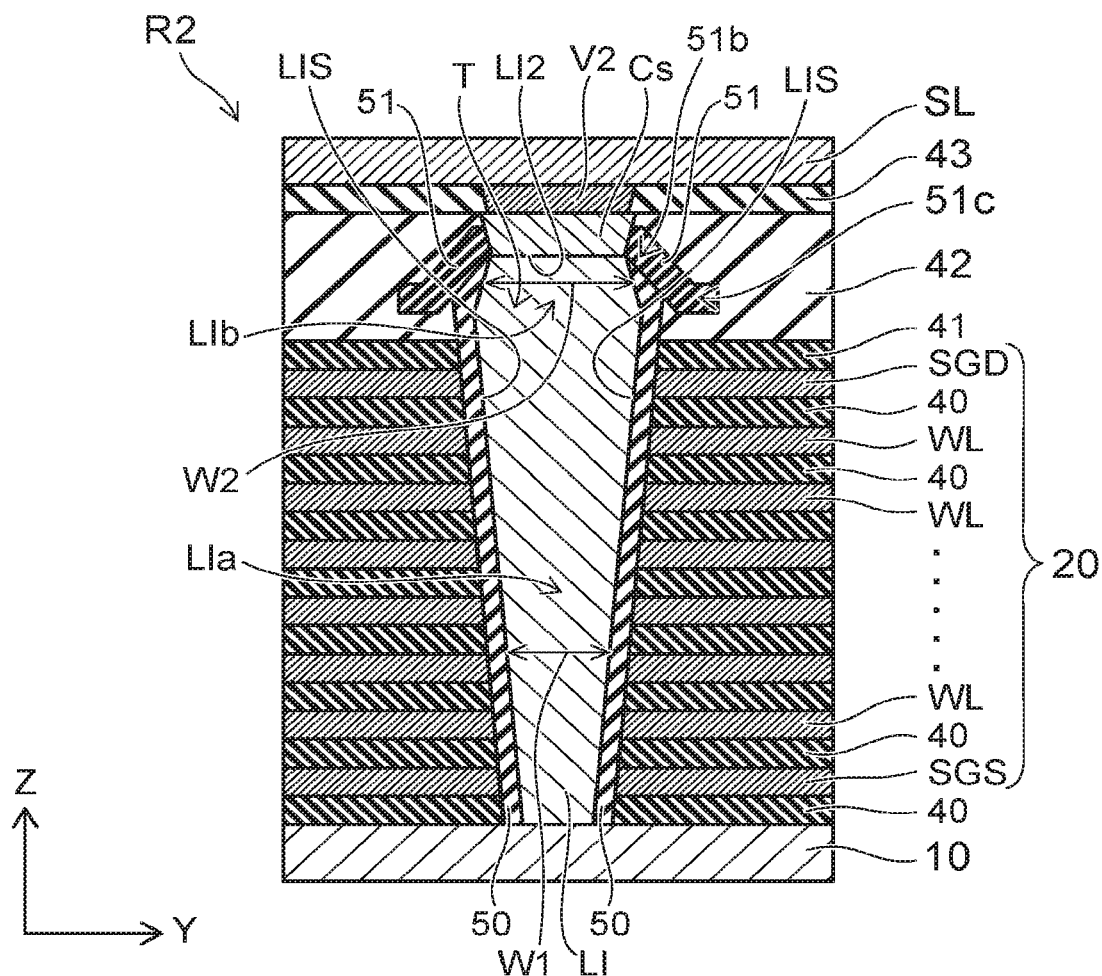
Figure 3D:
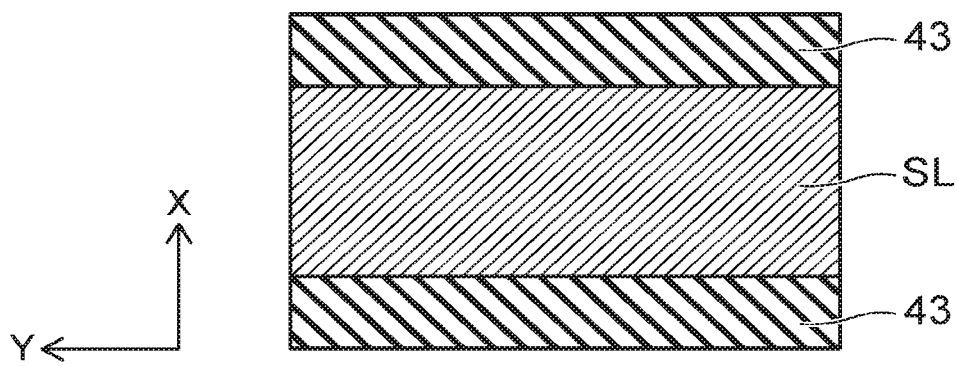

FIG. 1 shows a memory cell array in the semiconductor memory device 1. FIG. 2 is an enlarged view of FIG. 1, and is an X-Y plan view showing an area where columnar portions CL connect with bit lines BL and an area where an interconnect portion LI connects with a source line SL. FIG. 3A and FIG. 3B are enlarged views of FIG. 1, showing a Y-Z sectional view and an X-Y plan view, respectively, of the area where the columnar portions CL connect with the bit lines BL. FIG. 3C and FIG. 3D are enlarged views of FIG. 1, showing a Y-Z sectional view and an X-Y plan view, respectively, of the area where the interconnect portion LI connects with the source line SL.

In FIG. 1, two directions parallel to an upper surface of a substrate 10 and orthogonal to each other are defined as an X-direction and a Y-direction, and a direction orthogonal to both the X-direction and the Y-direction is defined as a Z-direction (stacking direction). In FIG. 1, an inter-layer insulating layer 42 and an inter-layer insulating layer 43 are not shown.

As shown in FIG. 1, the semiconductor memory device 1 includes the substrate 10, a stacked body 20, the plurality of columnar portions CL, the interconnect portions LI, and an upper layer interconnect. As the upper layer interconnect, the bit lines BL and the source line SL are shown.

The substrate 10 is, for example, a silicon substrate doped with an impurity to have conductivity.

The stacked body 20 includes a plurality of electrode layers WL, a plurality of insulating layers 40, a source-side select gate SGS, and a drain-side select gate SGD.

The plurality of electrode layers WL is separately stacked each other, and the plurality of insulating layers 40 is provided between the plurality of electrode layers WL. The plurality of electrode layers WL and the plurality of insulating layers 40 are alternately stacked one by one, for example. The number of the electrode layers WL may be arbitrary.

The source-side select gate SGS is provided in the lowermost layer of the stacked body 20. The drain-side select gate SGD is provided in the uppermost layer of the stacked body 20. The number of layers of the source-side select gates SGS and the number of layers of the drain-side select gates SGD may be arbitrary. Moreover, the stacked body 20 is provided between an insulating layer 40 and an insulating layer 41.

The electrode layer WL contains, for example, metal such as tungsten (W) and molybdenum (Mo). The electrode layer WL may be a layer containing silicon as a main component, and is, for example, a polycrystalline silicon layer. The electrode layer WL contains, for example, boron as an impurity to provide conductivity for the silicon layer. The insulating layer 40 includes, for example, an insulating layer containing silicon oxide ($SiO_2$).

The columnar portion CL is provided inside a memory hole MH piercing the stacked body 20. That is, the columnar portion CL extending in the Z-direction is provided in the stacked body 20. The columnar portion CL is provided in, for example, a circular cylinder or elliptic cylinder shape. The plurality of columnar portions CL is provided in, for example, a staggered arrangement. Alternatively, the plurality of columnar portions CL may be provided in a square grid pattern along the X-direction and the Y-direction. The columnar portion CL extends in the Z-direction and is buried in the insulating layers 40 and the electrode layers WL that configure memory cells MC.

The columnar portion CL includes a core insulating film 30, a semiconductor film 31 as a channel body, and a memory film 32. The core insulating film 30, the semiconductor film 31, and the memory film 32 extend continuously in the Z-direction. The semiconductor film 31 is provided between the core insulating film 30 and the memory film 32, and surrounds the core insulating film 30 from the outer circumferential side. The core insulating film 30 may not be provided inside the semiconductor film 31.

A lower end of the semiconductor film 31 is in contact with the substrate 10. The semiconductor film 31 is electrically connected with the source line SL via the substrate 10 and the interconnect portion LI.

The memory film 32 is provided between the semiconductor film 31 and the stacked body 20, and surrounds the semiconductor film 31 from the outer circumferential side. The memory film 32 includes a charge storage film. The memory film 32 is, for example, a stacked film including a tunnel insulating film, the charge storage film, and a block insulating film. In this case, the block insulating film, the charge storage film, and the tunnel insulating film are provided, in this order from a side of the stacked body 20, between the stacked body 20 and the semiconductor film 31.

The memory film 32 may be configured so as to include a floating gate. For example, the memory film 32 may be formed by removing the electrode layer WL and burying the floating gate therein.

The plurality of bit lines BL (for example, a metal film) is provided on the stacked body 20 with the insulating layer 41 and the inter-layer insulating layers 42 and 43 between the stacked body 20 and the plurality of bit lines BL. The plurality of bit lines BL is separated from each other in the X-direction, and extends in the Y-direction. An upper end of the semiconductor film 31 connects with the bit line BL via a contact portion Cb and a contact portion V1. A plurality of the semiconductor films 31 selected one by one from areas separated in the Y-direction connects with one common bit line BL.

A drain-side select transistor STD is provided at an upper end portion of the columnar portion CL, and a source-side select transistor STS is provided at a lower end portion. The memory cell MC, the drain-side select transistor STD, and the source-side select transistor STS are vertical transistors in which a current flows in the Z-direction.

The select gates SGD and SGS function as gate electrodes (control gates) of the select transistors STD and STS, respectively. The memory film 32 functioning as a gate insulating film of the select transistors STD and STS is provided between each of the select gates SGD and SGS and the semiconductor film 31.

The plurality of memory cells MC using each of the electrode layers WL as a control gate is provided between the drain-side select transistor STD and the source-side select transistor STS. The plurality of memory cells MC, the drain-side select transistor STD, and the source-side select transistor STS are connected in series through the semiconductor film 31 to configure one memory string. This memory string is provided in a plane direction parallel to an X-Y plane, for example, in a grid pattern, so that the plurality of memory cells MC is provided three-dimensionally in the X-direction, the Y-direction, and the Z-direction.

The semiconductor memory device of the embodiment can electrically freely erase or write data, and can hold a memory content even if power is off.

Hereinafter, the interconnect portion LI will be described.

As shown in FIG. 2, the semiconductor memory device 1 includes a first area R1 and a second area R2. The first area R1 is the area where the columnar portions CL connect with the bit lines BL via the contact portions Cb and the contact portions V1. For example, the memory cells MC are provided in the first area R1.

The second area R2 is the area where the interconnect portion LI connects with the source line SL via contact portions Cs and contact portions V2. For example, the second area R2 is provided so as to be contiguous to the first area R1. The interconnect portion LI electrically connects with a control circuit (not shown) via the source line SL.

As shown in FIG. 3A to FIG. 3D, the interconnect portion LI is provided in the first area R1 and the second area R2. The interconnect portion LI is provided so as to be interposed between the stacked bodies 20 adjacent to each other, and extends in the X-direction and the Z-direction in the stacked body 20. For example, the interconnect portion LI has a plate shape, and is provided inside a trench T that is formed to pierce the stacked body 20. For example, the interconnect portion LI is a metal material containing tungsten.

The interconnect portion LI includes a first interconnect portion LIa and a second interconnect portion LIb. The first interconnect portion LIa is provided on the substrate 10. For example, the first interconnect portion LIa is a portion whose width W1 in cross-section increases with increased distance from the substrate 10. The second interconnect portion LIb is provided on the first interconnect portion LIa, and is a portion whose width W2 in cross-section decreases with increased distance from the substrate 10.

In the first area R1, an insulating film 50 is provided on a side surface LIS of the interconnect portion LI. The insulating film 50 extends in the X-direction and the Z-direction so as to cover the side surface LIS of the interconnect portion LI. The insulating film 50 is provided on a side surface of the first interconnect portion LIa and a side surface of the second interconnect portion LIb. Electrical contact between the interconnect portion LI and the stacked body 20 (for example, the electrode layer WL) is inhibited by the insulating film 50.

In the first area R1, an insulating film 51 is provided on an upper surface LI1 of the interconnect portion LI. The insulating film 51 extends in the X-direction so as to cover the upper surface LI1 of the interconnect portion LI. That is, the insulating film 51 includes a first portion 51a provided on the upper surface LI1 of the interconnect portion LI. Moreover, the insulating film 51 is provided on a portion of the side surface LIS of the interconnect portion LI with the insulating film 50 between the portion of the side surface LIS and the insulating film 51. The insulating film 51 extends in the X-direction so as to cover the portion of the side surface LIS of the interconnect portion LI with the insulating film 50 between the portion of the side surface LIS and the insulating film 51. That is, the insulating film 51 includes a second portion 51b provided on the portion of the side surface LIS of the interconnect portion LI with the insulating film 50 between the portion of the side surface LIS and the insulating film 51.

In the first area R1, an edge of the insulating film 51 is provided so as to extend in the Y-direction. That is, the insulating film 51 includes a third portion 51c provided so as to extend in the Y-direction. For example, the third portion 51c is provided to face the contact portion Cb in the Y-direction so that a distance in the Y-direction between the interconnect portion LI and the contact portion Cb is maintained. For example, the third portion 51c protrudes toward the contact portion Cb.

In the second area R2, the insulating film 50 is provided on the side surface LIS of the interconnect portion LI. Moreover, the insulating film 51 is provided on the interconnect portion LI with the insulating film 50 between the interconnect portion LI and the insulating film 51. The insulating film 51 includes the first portion 51a provided on an upper surface LI2 of the interconnect portion LI, the second portion 51b provided on a portion of the side surface LIS of the interconnect portion LI with the insulating film 50 between the portion of the side surface LIS and the second portion 51b, and the third portion 51c provided so as to extend in the Y-direction. The insulating film 51 (the first portion 51a) is not provided on the upper surface LI2 of the interconnect portion LI at a portion connecting with the source line SL via the contact portion Cs and the contact portion V2.

The third portion 51c, the second portion 51b, and the first portion 51a of the insulating film 51 are provided in this order from the lower side to the upper side in the inter-layer insulating layer 42. A distance in the Z-direction between the third portion 51c and the stacked body 20 is shorter than a distance in the Z-direction between the first portion 51a and the stacked body 20 and a distance in the Z-direction between the second portion 51b and the stacked body 20. Moreover, the distance in the Z-direction between the second portion 51b and the stacked body 20 is shorter than the distance in the Z-direction between the first portion 51a and the stacked body 20.

The insulating film 50 and the insulating film 51 are, for example, films containing a silicon compound. The insulating film 50 and the insulating film 51 can include, for example, a silicon oxide film, a silicon nitride (SiN) film, and a TEOS (Tetra ethyl Ortho Silicate) film. Moreover, the insulating film 50 and the insulating film 51 can include, for example, a film containing hafnium oxide ($Hf_xO_y$). For example, the insulating film 50 and the insulating film 51 can be formed of films containing different materials. For example, the insulating film 50 is formed of a silicon oxide film, and the insulating film 51 is formed of a silicon nitride film. In consideration of etching selectivity for the inter-layer insulating layer 42 in the formation of the contact portion Cb, the insulating film 51 can be formed using a material different from the inter-layer insulating layer 42.

Hereinafter, a method for manufacturing the semiconductor memory device 1 will be described.

FIG. 4A and FIG. 4B to FIG. 20A to FIG. 20D show the method for manufacturing the semiconductor memory device according to the first embodiment.

Figure 21:
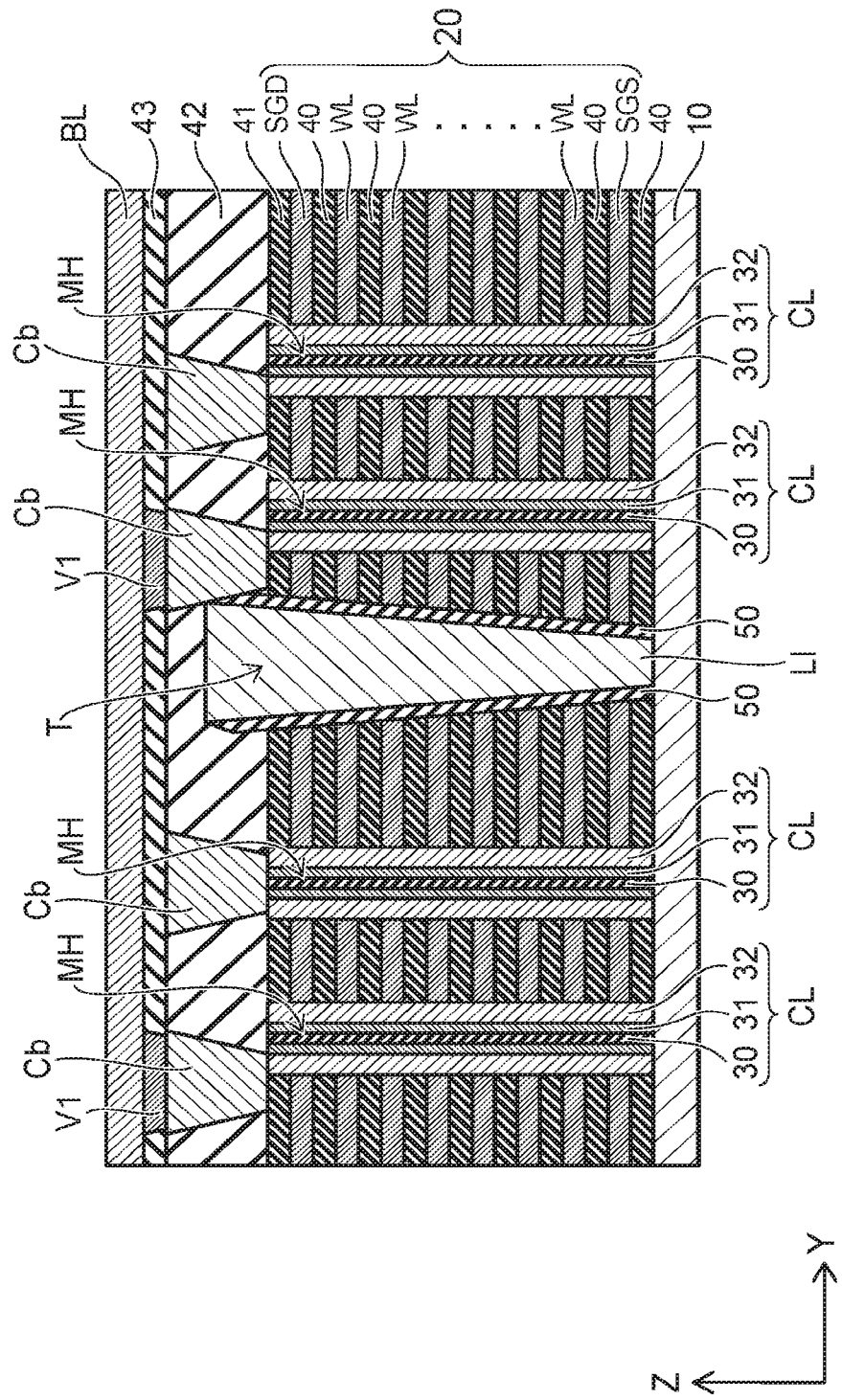
FIG. 21 is a reference diagram showing a cross-section of a portion of a semiconductor memory device.

FIG. 21 is a reference diagram showing a cross-section of a portion of a semiconductor memory device.

FIG. 4A and FIG. 4B to FIG. 20A to FIG. 20D show a method for manufacturing a memory cell array of the semiconductor memory device 1. FIG. 21 is a reference diagram corresponding to the cross-section of FIG. 3A.

Figure 4A:
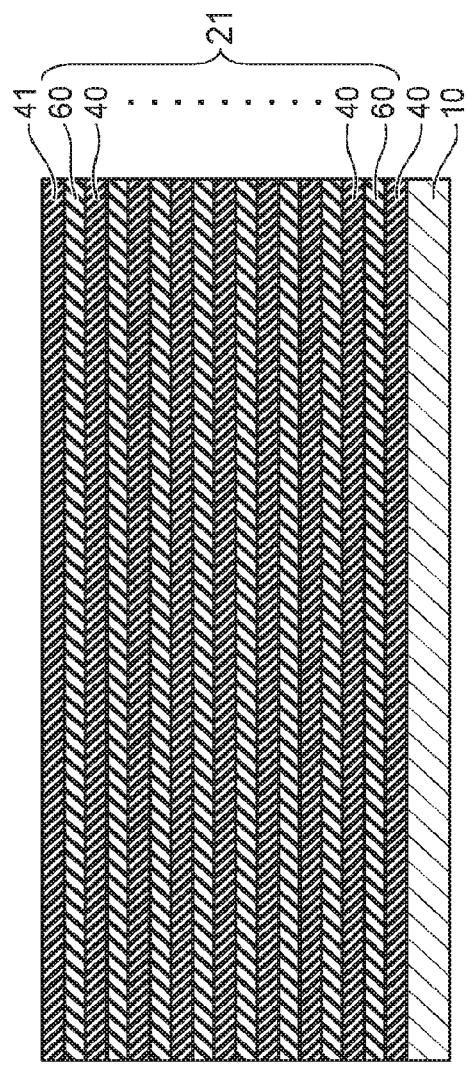
Figure 4B:
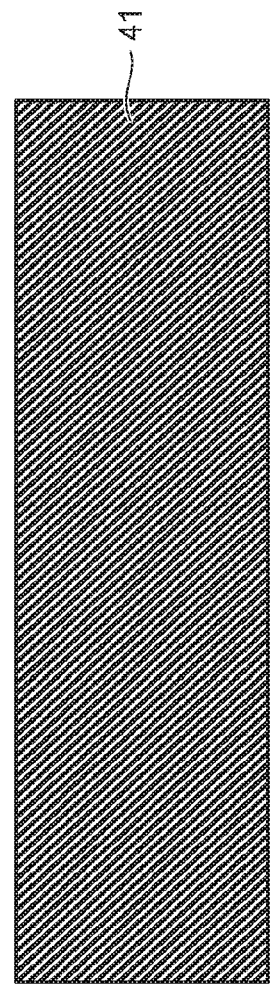
Figure 17A:
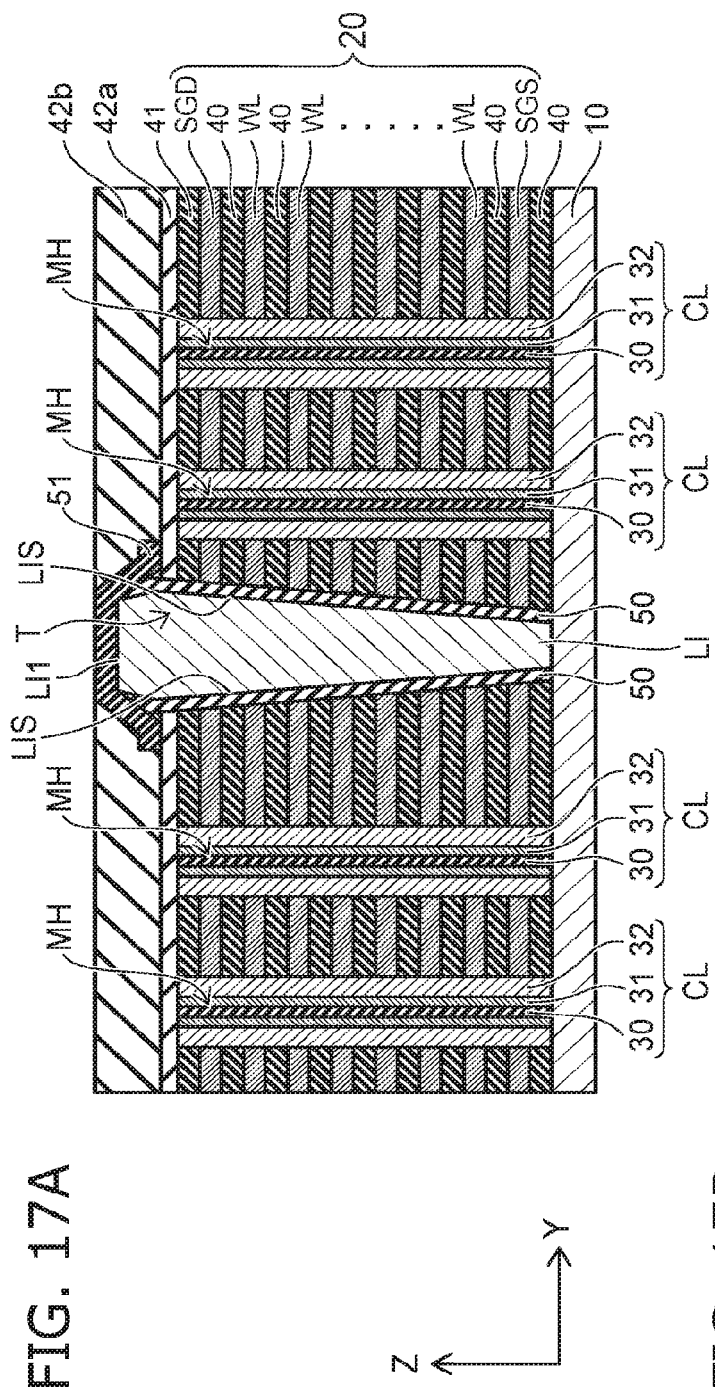
Figure 17B:
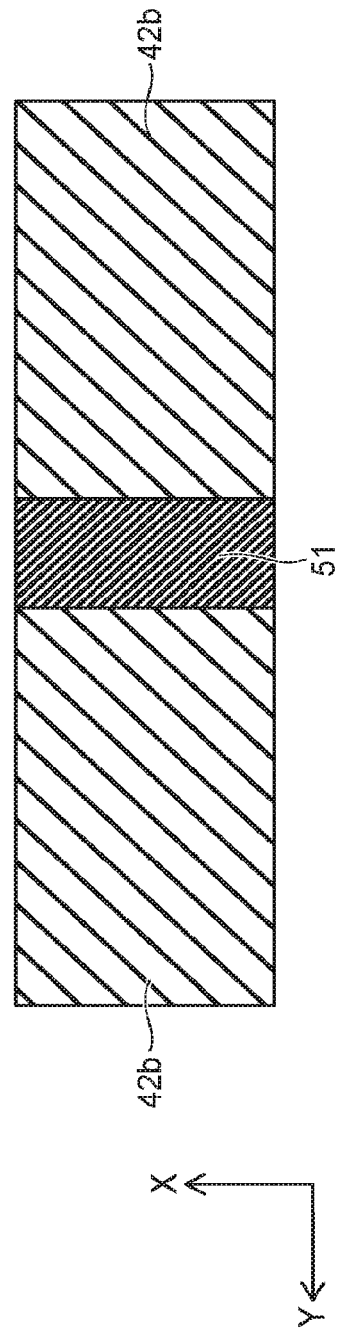
Figure 17C:
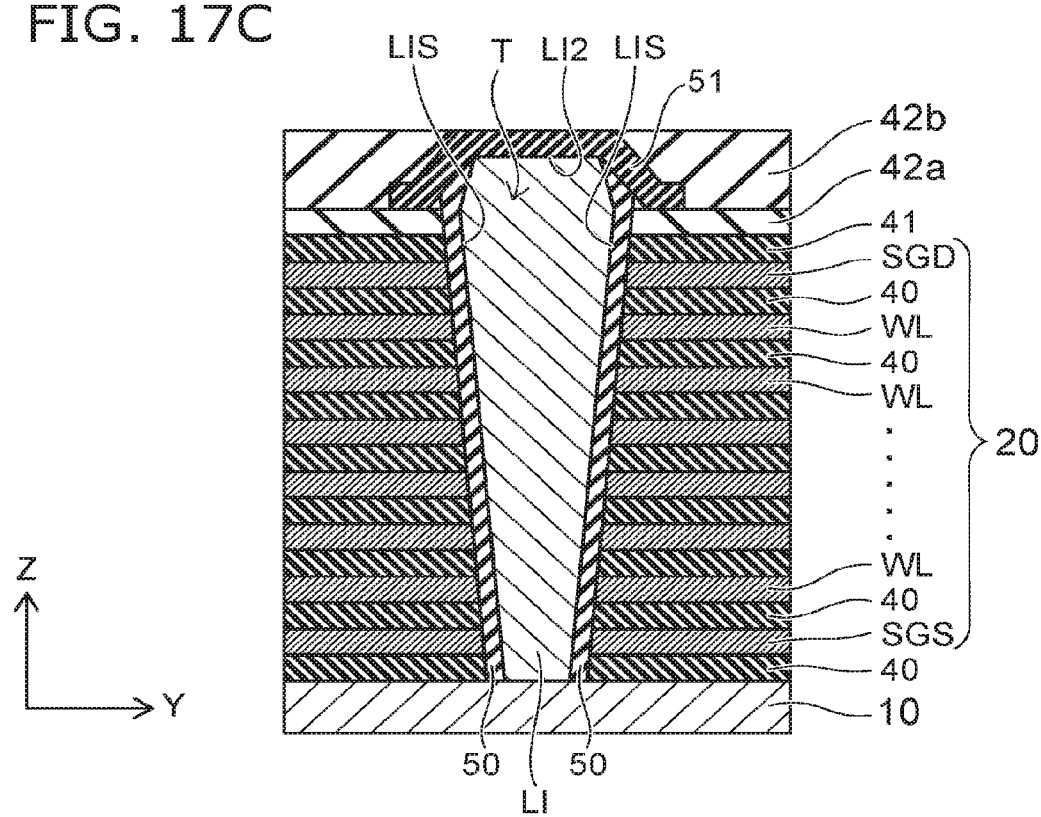
Figure 17D:
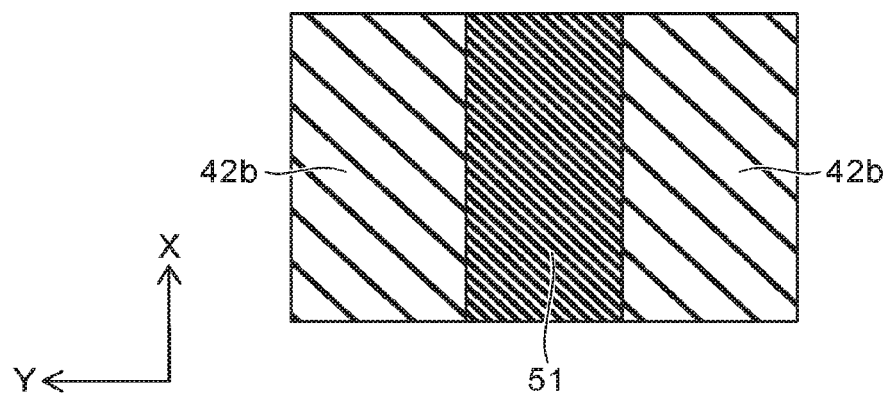

FIG. 4A shows a cross-section corresponding to FIG. 3A, and FIG. 4B shows a plane corresponding to FIG. 3B. The same applies to FIG. 5A and FIG. 5B to FIG. 16A and FIG. 16B. Moreover, FIG. 17A shows a cross-section corresponding to FIG. 3A, and FIG. 17B shows a plane corresponding to FIG. 3B. FIG. 17C shows a cross-section corresponding to FIG. 3C, and FIG. 17D shows a plane corresponding to FIG. 3D. The same applies to FIG. 18A to FIG. 18D to FIG. 20A to FIG. 20D.

That is, FIG. 4A and FIG. 4B to FIG. 20A and FIG. 20B show the first area, and FIG. 17C and FIG. 17D to FIG. 20C and FIG. 20D show the second area.

As shown in FIG. 4A and FIG. 4B, the insulating layers 40 and sacrifice layers 60 are alternately stacked on the substrate 10. The insulating layer 41 is formed on a stacked body 21 including the sacrifice layers 60 and the insulating layers 40 alternately stacked. The uppermost layer and the lowermost layer of the stacked body 21 are the sacrifice layers 60. The insulating layer 40 and the insulating layer 41 are formed of, for example, silicon oxide. The sacrifice layer 60 is formed of, for example, silicon nitride.

As shown in FIG. 5A and FIG. 5B, openings op1 and op2 piercing the insulating layer 40, the stacked body 21, and the insulating layer 41 are formed. The openings op1 and op2 are formed by, for example, photolithography and etching. The openings op1 and op2 serve as the memory holes MH (through-holes). FIG. 5A shows the openings op1 among the openings op1 and op2 shown in FIG. 5B.

Figure 6A:
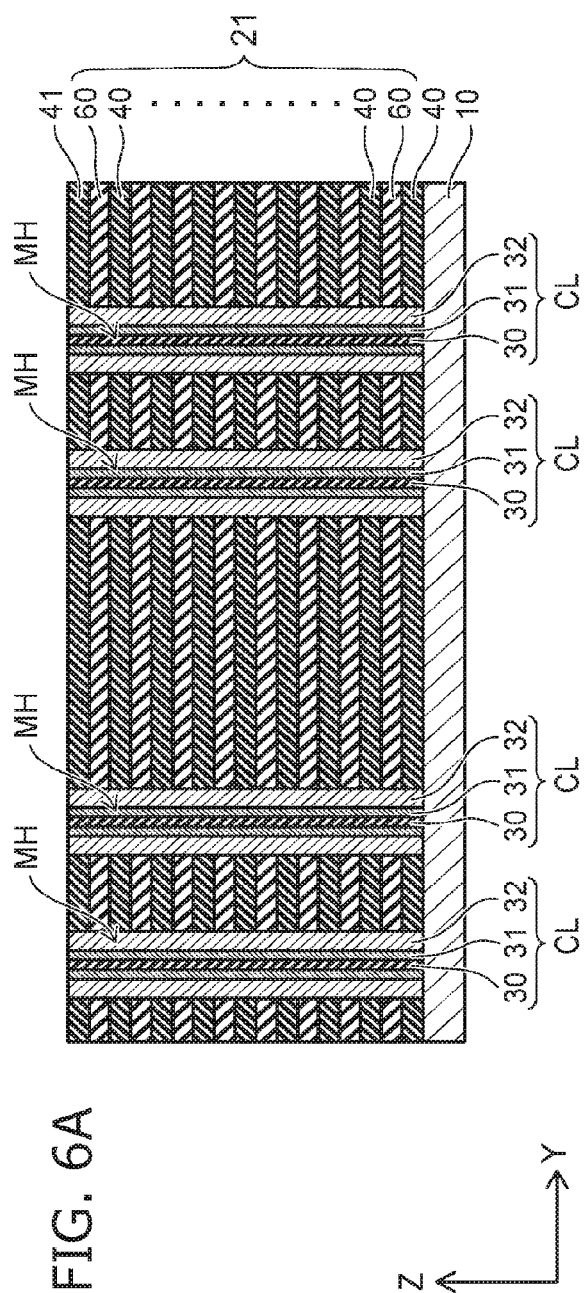
Figure 6B:
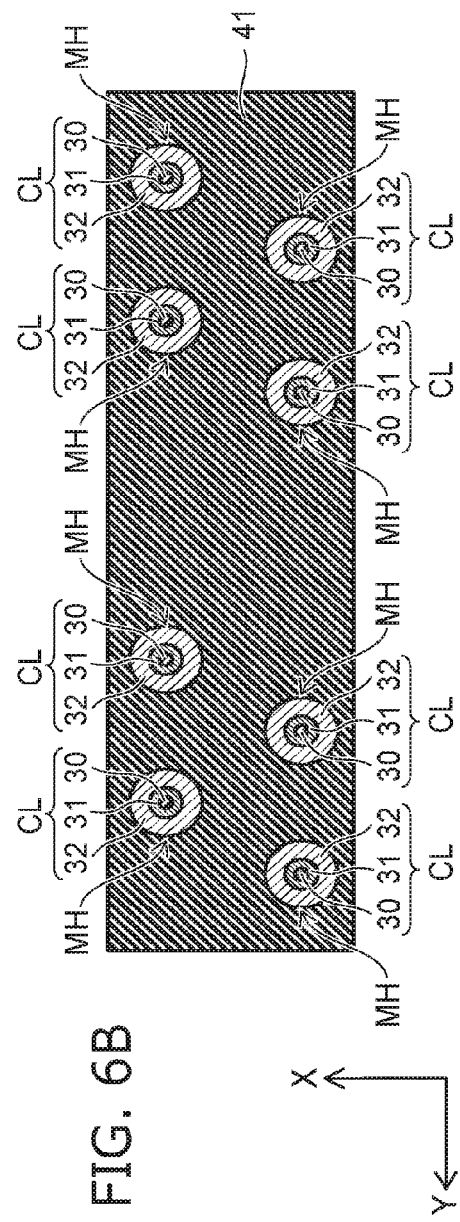

As shown in FIG. 6A and FIG. 6B, the memory film 32, the semiconductor film 31, and the core insulating film 30 are formed in the memory holes MH. Due to this, the columnar portions CL are formed. The memory film 32 is formed of, for example, a stacked film of silicon nitride and silicon oxide. The semiconductor film 31 is, for example, a silicon film containing silicon as a main component. The core insulating film 30 is formed of, for example, silicon oxide.

As shown in FIG. 7A and FIG. 7B, an insulating layer 42a is formed on the insulating layer 41 and the columnar portion CL. The insulating layer 42a can be formed of, for example, a material such as silicon oxide, silicon nitride, or TEOS.

As shown in FIG. 8A and FIG. 8B, the trench T piercing the insulating layer 40, the stacked body 21, the insulating layer 41, and the insulating layer 42a is formed. The trench T is formed by, for example, etching.

As shown in FIG. 9A and FIG. 9B, the sacrifice layers 60 are removed through the trench T. With the removal of the sacrifice layers 60, cavities 60a are formed. The sacrifice layers 60 are removed by, for example, wet etching using a phosphoric acid solution.

As shown in FIG. 10A and FIG. 10B, a conductive layer 61 is formed through the trench T. The conductive layer 61 is formed on the entire surface by, for example, a CVD (Chemical Vapor Deposition) method.

As shown in FIG. 11A and FIG. 11B, the conductive layer 61 formed on an inner wall surface of the trench T and the insulating layer 42a is removed. For example, a portion of the conductive layer 61 is removed by etching. Due to this, the stacked body 20 including the plurality of electrode layers WL, the plurality of insulating layers 40, the source-side select gate SGS, and the drain-side select gate SGD is formed.

Figure 12A:
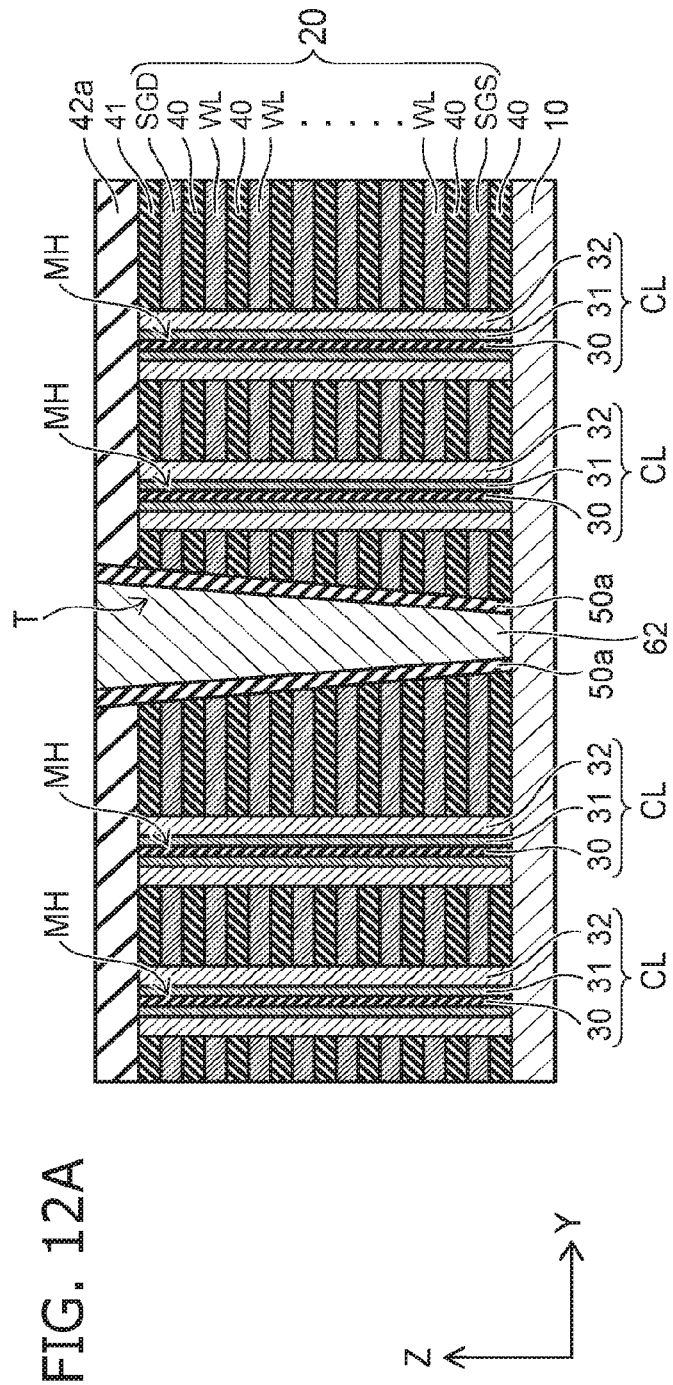
Figure 12B:
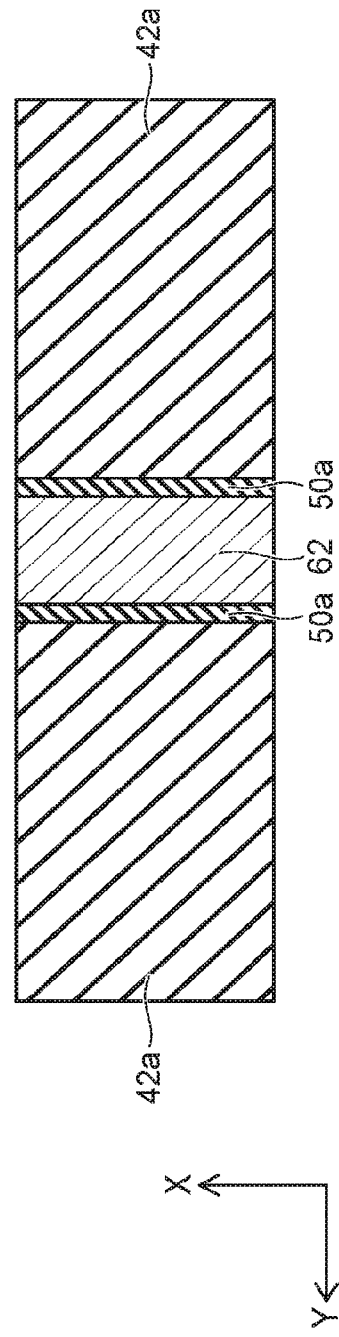

As shown in FIG. 12A and FIG. 12B, an insulating film 50a is formed on an inner surface of the trench T, and the insulating film 50a on a bottom surface of the trench T is removed. For example, in the insulating film 50a formed in the trench T, a portion covering the substrate 10 is removed by anisotropic etching or the like. Thereafter, a conductive film 62 is buried in the trench T, and the conductive film 62 formed on the insulating layer 42a is removed to planarize the surface. For example, the conductive film 62 is removed by a CMP (Chemical Mechanical Polishing) method or the like to planarize the surface. A film or the like containing titanium (Ti) may be formed between the conductive film 62 and the insulating film 50a.

As shown in FIG. 13A and FIG. 13B, a portion of the insulating layer 42a, a portion of the insulating film 50a, and a portion of a side wall of the conductive film 62 are removed. Due to this, an edge 62t of the conductive film 62 protrudes from the insulating layer 42a and the insulating film 50a. The interconnect portion LI is formed of the conductive film 62. The edge 62t has a convex shape, and is a portion that reduces a width in cross-section of the conductive film 62 from a surface 42a1 of the insulating layer 42a toward a tip of the edge 62t. That is, the edge 62t is a portion corresponding to the second interconnect portion LIb of the interconnect portion LI.

Figures 14A, 14B:
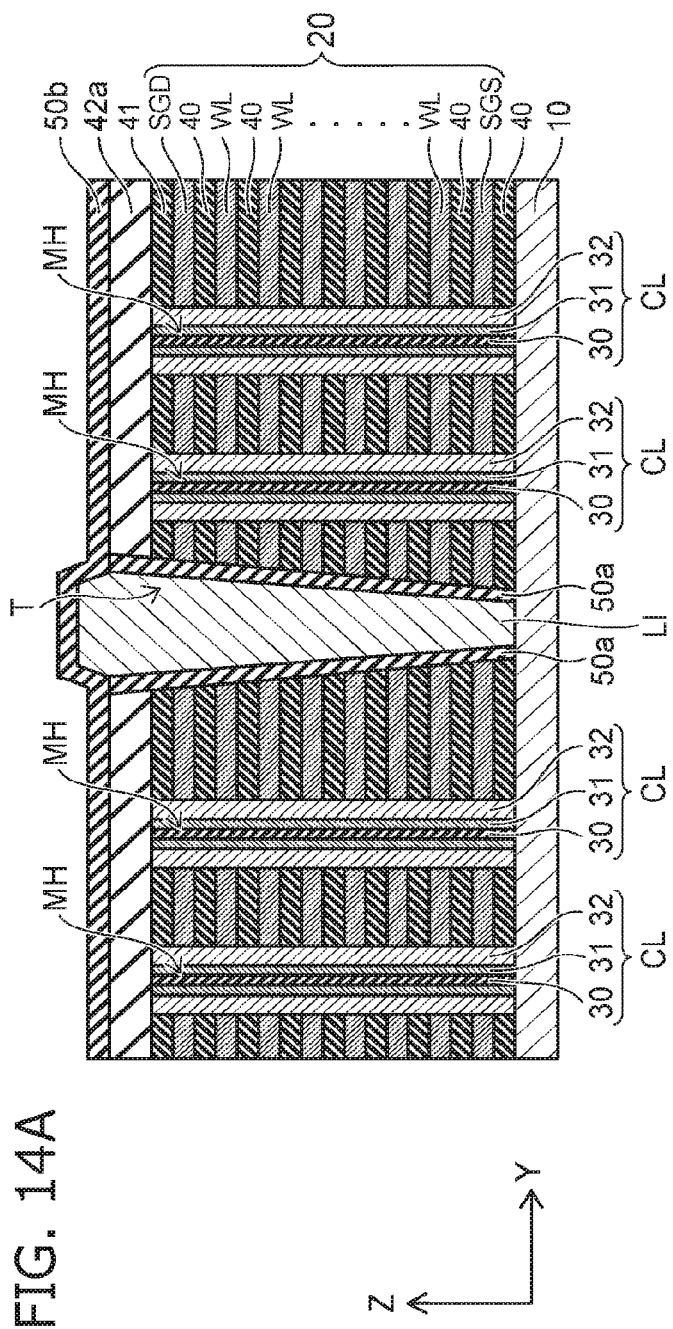

As shown in FIG. 14A and FIG. 14B, an insulating film 50b is formed so as to cover the protruding portion (the second interconnect portion LIb) of the interconnect portion LI.

Figures 15A, 15B:
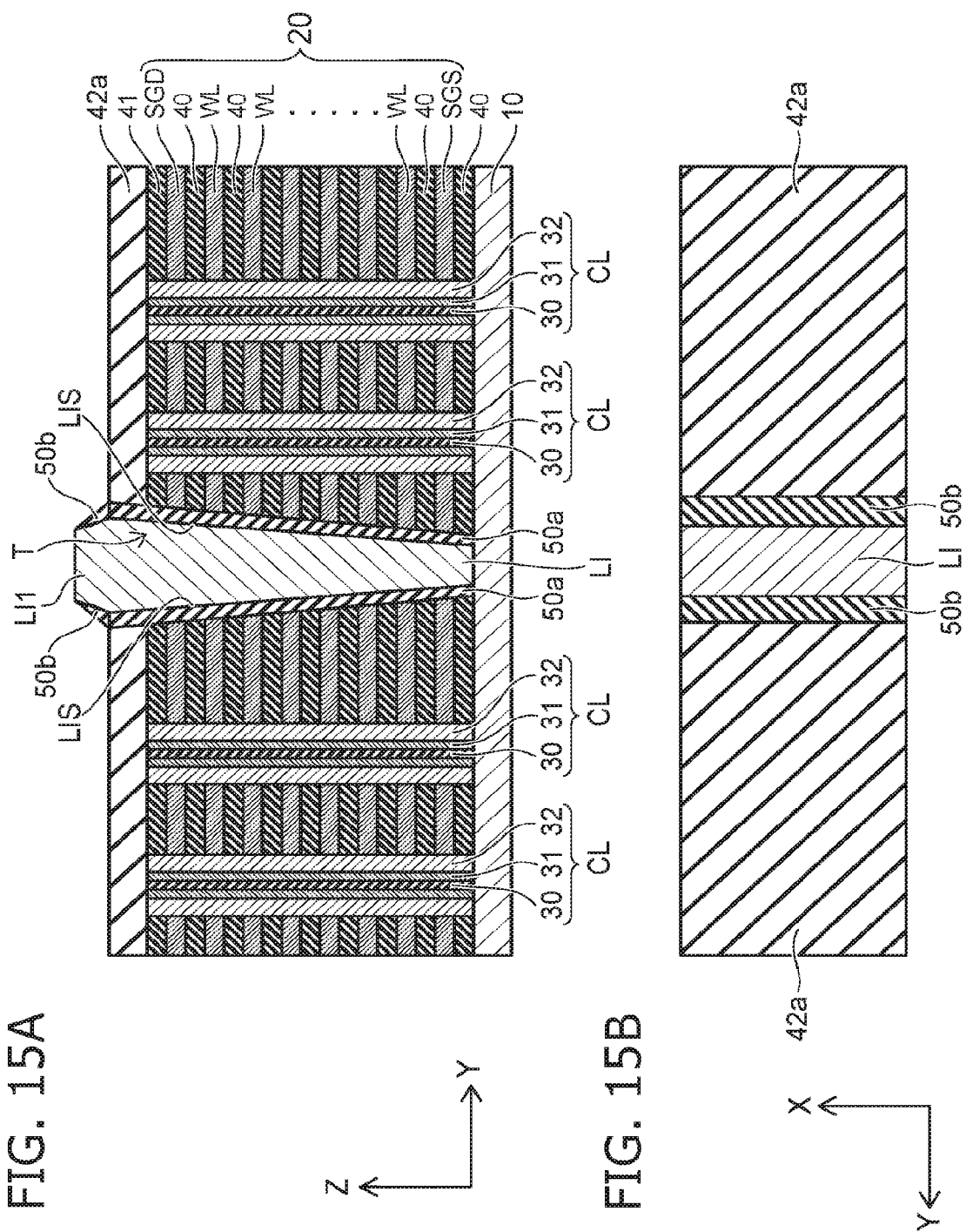

As shown in FIG. 15A and FIG. 15B, a portion of the insulating film 50b is removed. For example, the insulating film 50b formed on the insulating layer 42a and the insulating film 50b formed on the upper surface LI1 of the interconnect portion LI are removed by etching or the like. Due to this, a portion of the side surface LIS of the interconnect portion LI is covered with the insulating film 50b, and the insulating film 50 composed of the insulating film 50a and the insulating film 50b is formed.

As shown in FIG. 16A and FIG. 16B, the insulating film 51 is formed so as to cover the upper surface ill of the interconnect portion LI and a portion of the side surface LIS of the interconnect portion LI with the insulating film 50 between the portion of the side surface LIS and the insulating film 51. Moreover, an edge of the insulating film 51 extends in the Y-direction. The insulating film 51 is formed by, for example, photolithography and etching.

As shown in FIG. 17A to FIG. 17D, an insulating layer 42b is formed so as to cover a portion of the insulating film 51 and the insulating layer 42a. Moreover, a surface of the insulating layer 42b is planarized by a CMP method or the like. The insulating layer 42b can be formed of, for example, a material such as silicon oxide, silicon nitride, or TEOS. As shown in FIG. 17A and FIG. 17B, in the first area R1, the insulating film 51 covers the upper surface LI1 of the interconnect portion LI. As shown in FIG. 17C and FIG. 17D, in the second area R2, the insulating film 51 covers the upper surface LI2 of the interconnect portion LI.

Figures 18A, 18B:
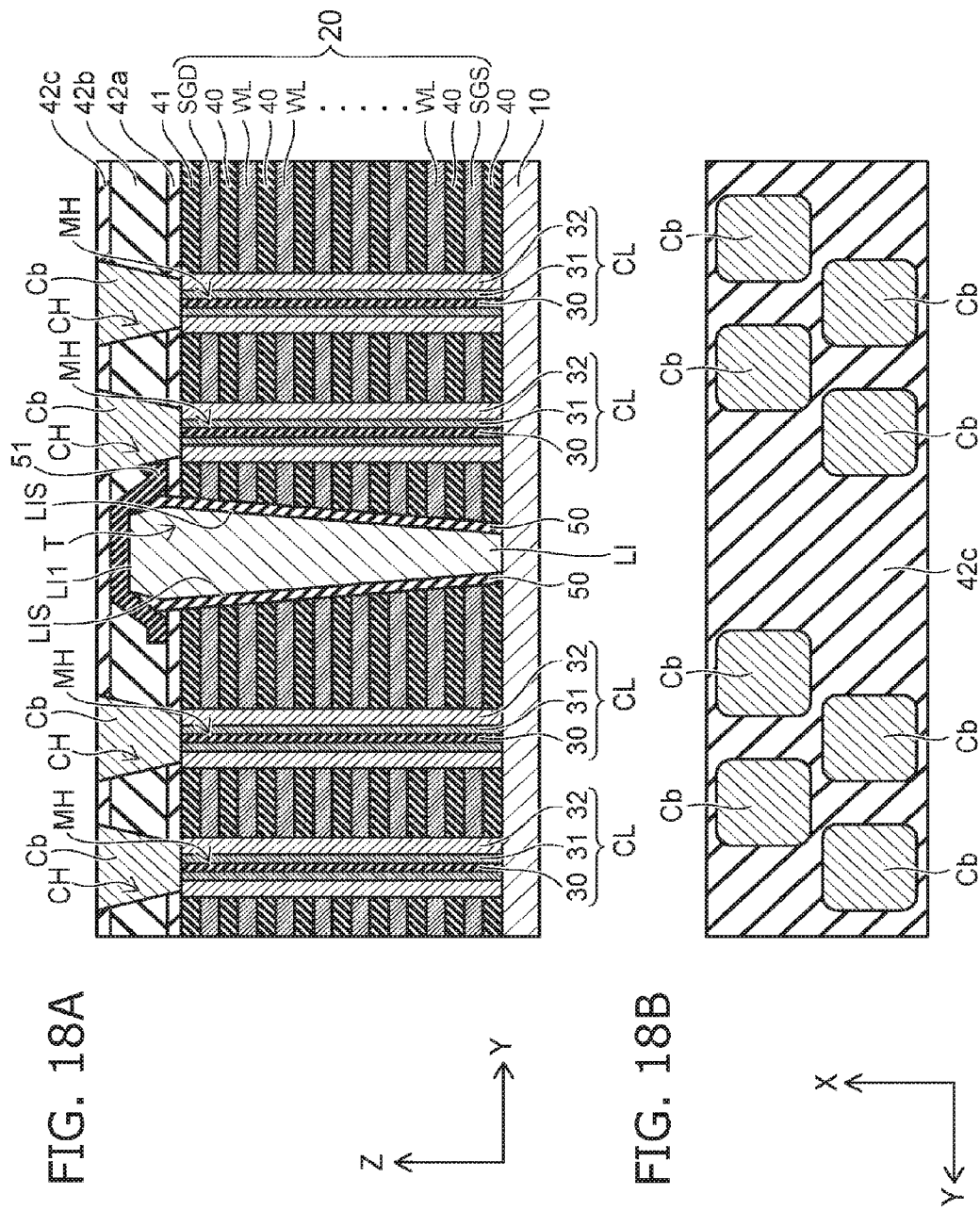

As shown in FIG. 18A and FIG. 18B, in the first area R1, after an insulating layer 42c is formed on a portion of the insulating film 51 and the insulating layer 42b, the contact portion Cb is formed on the columnar portion CL. The insulating layer 42c can be formed of, for example, a material such as silicon oxide, silicon nitride, or TEOS. Due to this, the inter-layer insulating layer 42 composed of the insulating layer 42a, the insulating layer 42b, and the insulating layer 42c is formed.

The contact portion Cb is formed by, for example, forming a resist pattern (not shown) on the inter-layer insulating layer 42 by photolithography, applying etching using the resist pattern as a mask to form, in the inter-layer insulating layer 42, a contact hole CH reaching the columnar portion CL, and burying a conductive material in the contact hole CH. In the formation of the resist pattern, even if misalignment in which the resist pattern is shifted to a side of the interconnect portion LI occurs, the insulating film 51 is not etched and the contact hole CH is formed so as to turn around the insulating film 51 because the etching rate of the insulating film 51 is lower than the etching rate of the inter-layer insulating layer 42. Due to this, contact between the interconnect portion LI and the contact portion Cb is inhibited by the insulating film 51. In this case, the insulating film 51 is a stopper film that inhibits the contact between the interconnect portion LI and the contact portion Cb. Due to this, it is possible to inhibit the occurrence of a short circuit between the bit line BL and the source line SL through the interconnect portion LI. Moreover, by inhibiting the contact between the interconnect portion LI and the contact portion Cb, a breakdown voltage between the interconnect portion LI and the contact portion Cb can be ensured.

Figure 18C:
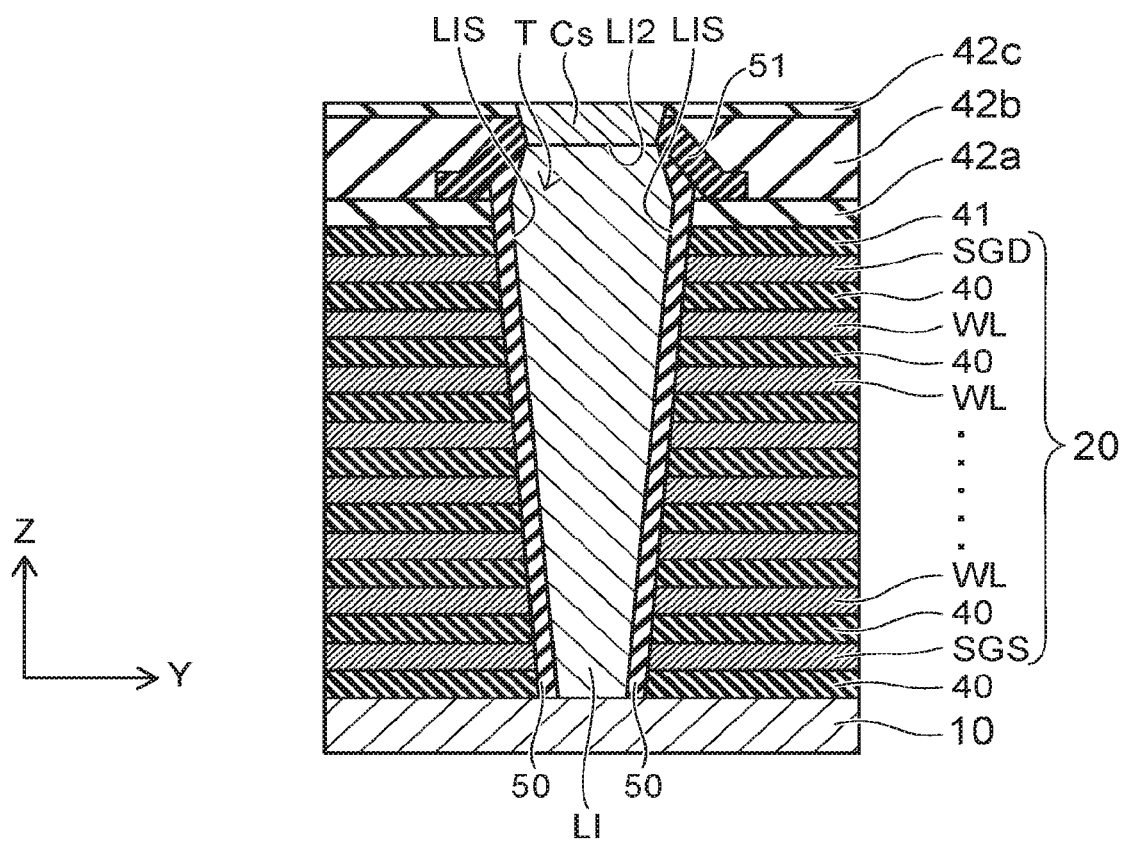
Figure 18D:
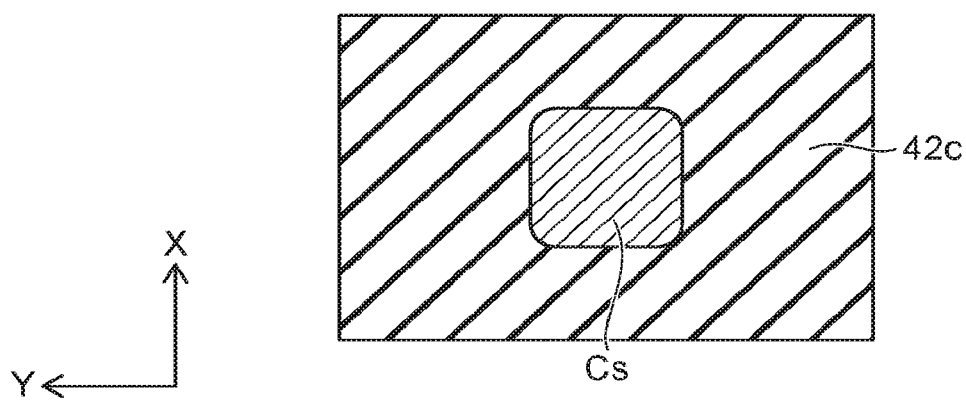

As shown in FIG. 18C and FIG. 18D, in the formation of the insulating layer 42c and the contact portion Cb in the first area R1, the contact portion Cs is formed on the interconnect portion LI in the second area R2. That is, in the second area R2, after the insulating layer 42c is formed on the interconnect portion LI and the insulating layer 42b, the contact portion Cs is formed on the interconnect portion LI. For example, after the formation of the insulating layer 42c, the insulating layer 42c formed on the upper surface LI2 of the interconnect portion LI is etched under the condition with etching selectivity relative to the insulating film 51. Subsequently, the insulating film 51 formed on the upper surface LI2 of the interconnect portion LI is etched. Due to this, a hole is formed on the interconnect portion LI, and a conductive material is buried in the hole to thereby form the contact portion Cs.

As shown in FIG. 19A and FIG. 19B, in the first area R1, after the inter-layer insulating layer 43 is formed on the contact portion Cb and the inter-layer insulating layer 42, the contact portion V1 is formed on the contact portion Cb. The inter-layer insulating layer 43 can be formed of, for example, a material such as silicon nitride or TEOS. The contact portion V1 is formed by, for example, photolithography and etching. FIG. 19A shows only the contact portions V1 that connect with a common bit line BL, among the contact portions V1 shown in FIG. 19B.

Figure 19C:
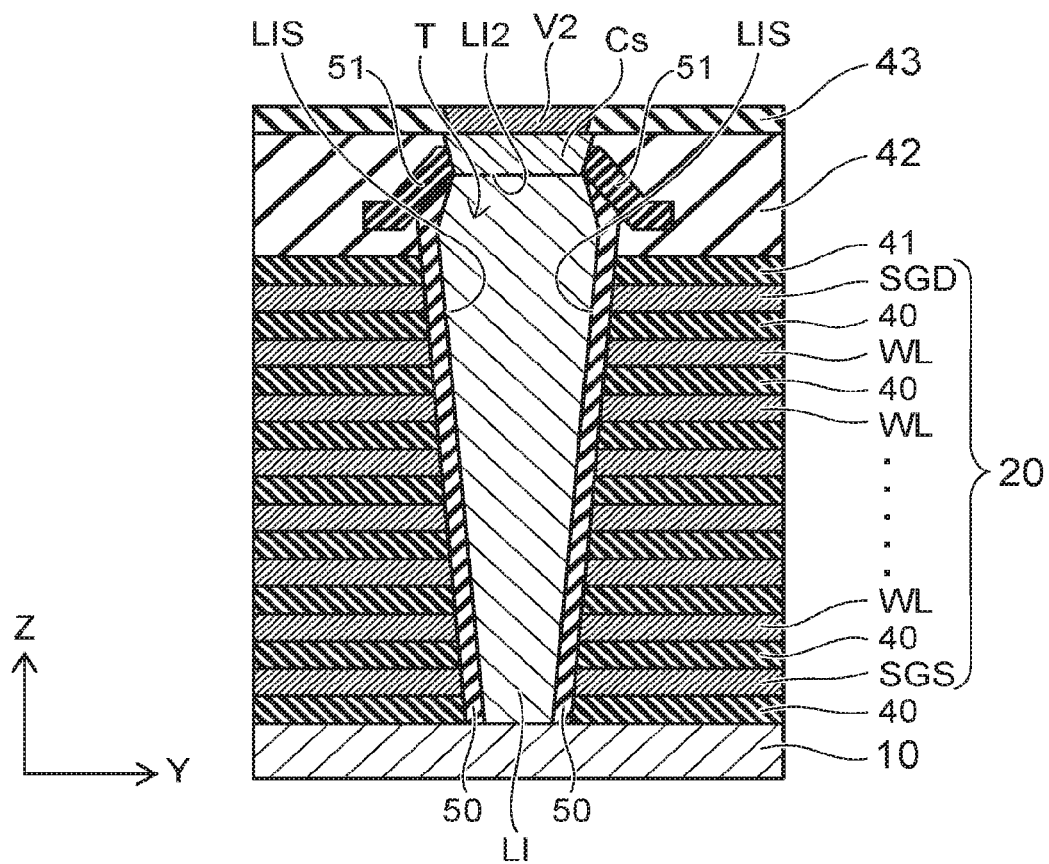
Figure 19D:
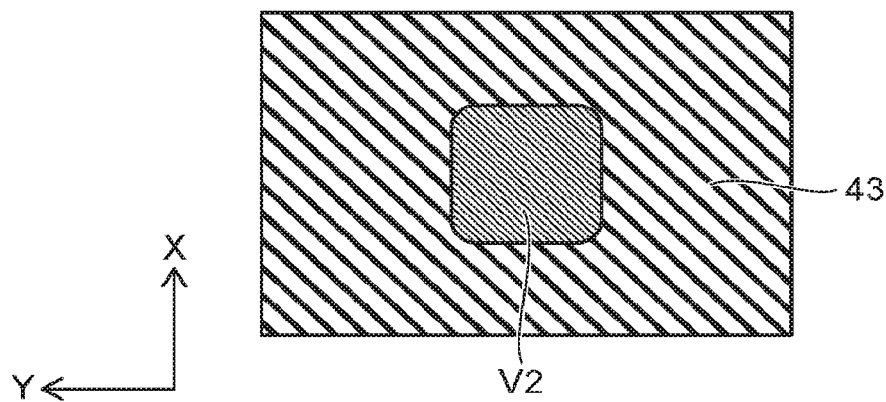

As shown in FIG. 19C and FIG. 19D, in the formation of the inter-layer insulating layer 43 and the contact portion V1 in the first area R1, the contact portion V2 is formed on the contact portion Cs in the second area R2. That is, in the second area R2, after the inter-layer insulating layer 43 is formed on the contact portion Cs and the inter-layer insulating layer 42, the contact portion V2 is formed on the contact portion Cs. The contact portion V2 is formed by, for example, photolithography and etching.

As shown in FIG. 20A and FIG. 20B, in the first area R1, the plurality of bit lines BL connecting with the semiconductor films 31 of the columnar portions CL via the contact portion Cb and the contact portion V1 are formed. Due to this, the plurality of semiconductor films 31 selected one by one from the areas separated in the Y-direction connects with one common bit line BL.

Figure 20C:
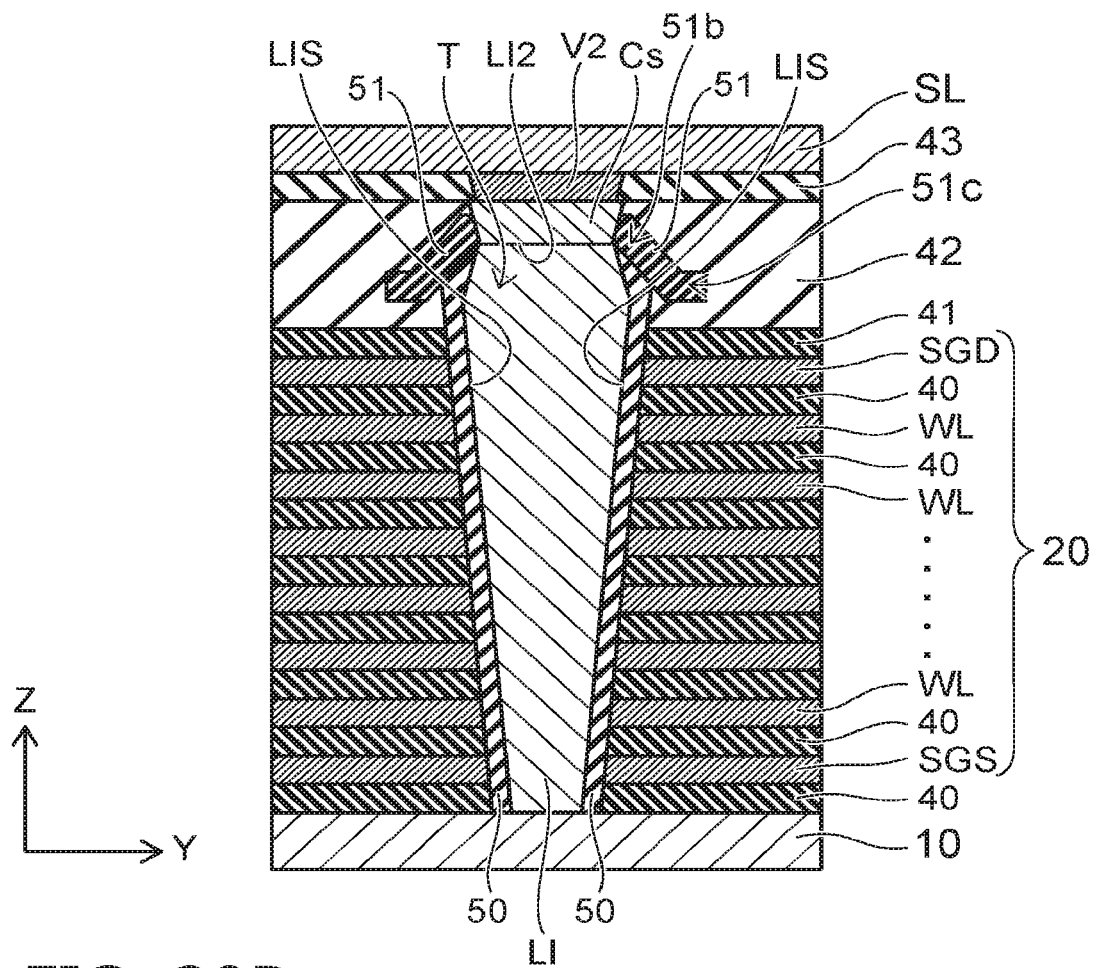
Figure 20D:
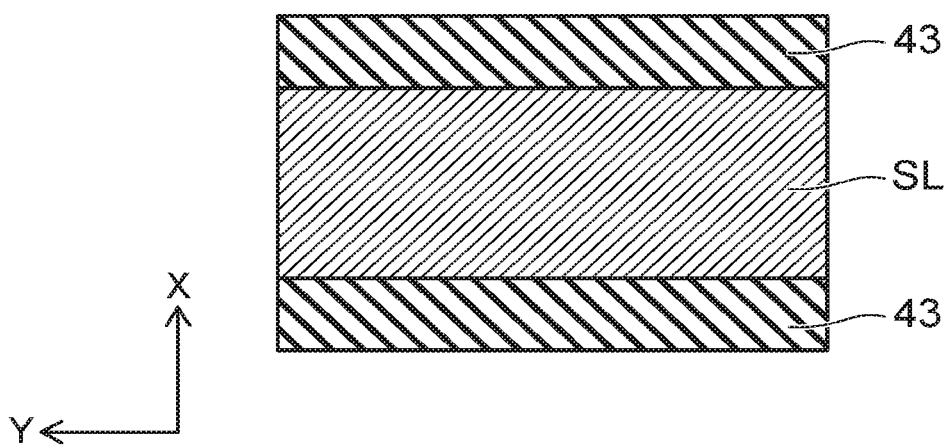

As shown in FIG. 20C and FIG. 20D, in the formation of the bit lines BL in the first area R1, the source line SL connecting with the interconnect portion LI via the contact portion Cs and the contact portion V2 is formed in the second area R2. Due to this, the interconnect portion LI electrically connects with the control circuit via the source line SL.

In this manner, the semiconductor memory device 1 according to the embodiment is manufactured.

Hereinafter, advantages of the embodiment will be described.

In the first area R1, the contact portion Cb is located on the semiconductor film 31, and the semiconductor film 31 and the bit line BL are electrically connected via the contact portion Cb. When the shrinkage of the semiconductor memory device progresses, the contact portion Cb may be shifted in the Y-direction from a desired position, as shown in FIG. 21, in the formation of the contact portion Cb. For example, when the position of an upper portion of the semiconductor film 31 in the Y-direction and the position of an upper portion of the interconnect portion LI in the Y-direction are shifted with respect to respective design values, position shift of the contact portion Cb in the Y-direction occurs. When the contact portion Cb is shifted in the Y-direction, the interconnect portion LI and the contact portion Cb may contact each other. When the interconnect portion LI and the contact portion Cb contact each other, the bit line BL and the source line SL are electrically connected via the interconnect portion LI. A short circuit may occur between the bit line BL and the source line SL via the interconnect portion LI.

In the semiconductor memory device 1 according to the embodiment, the insulating film 51 covers the upper surface LI1 of the interconnect portion LI and covers a portion of the side surface LIS of the interconnect portion LI with the insulating film 50 between the portion of the side surface LIS and the insulating film 51. Moreover, the edge of the insulating film 51 is provided so as to extend in the Y-direction. When the insulating film 51 described above is provided, if the contact portion Cb is shifted in the Y-direction in the first area R1 in the formation of the contact portion Cb, the contact hole CH is formed so as to turn around the insulating film 51. Therefore, the contact between the interconnect portion LI and the contact portion Cb can be inhibited. Due to this, it is possible to inhibit the occurrence of a short circuit between the bit line BL and the source line SL.

Hereinafter, variations of the semiconductor memory device 1 will be described.

Second Embodiment

Figure 22:
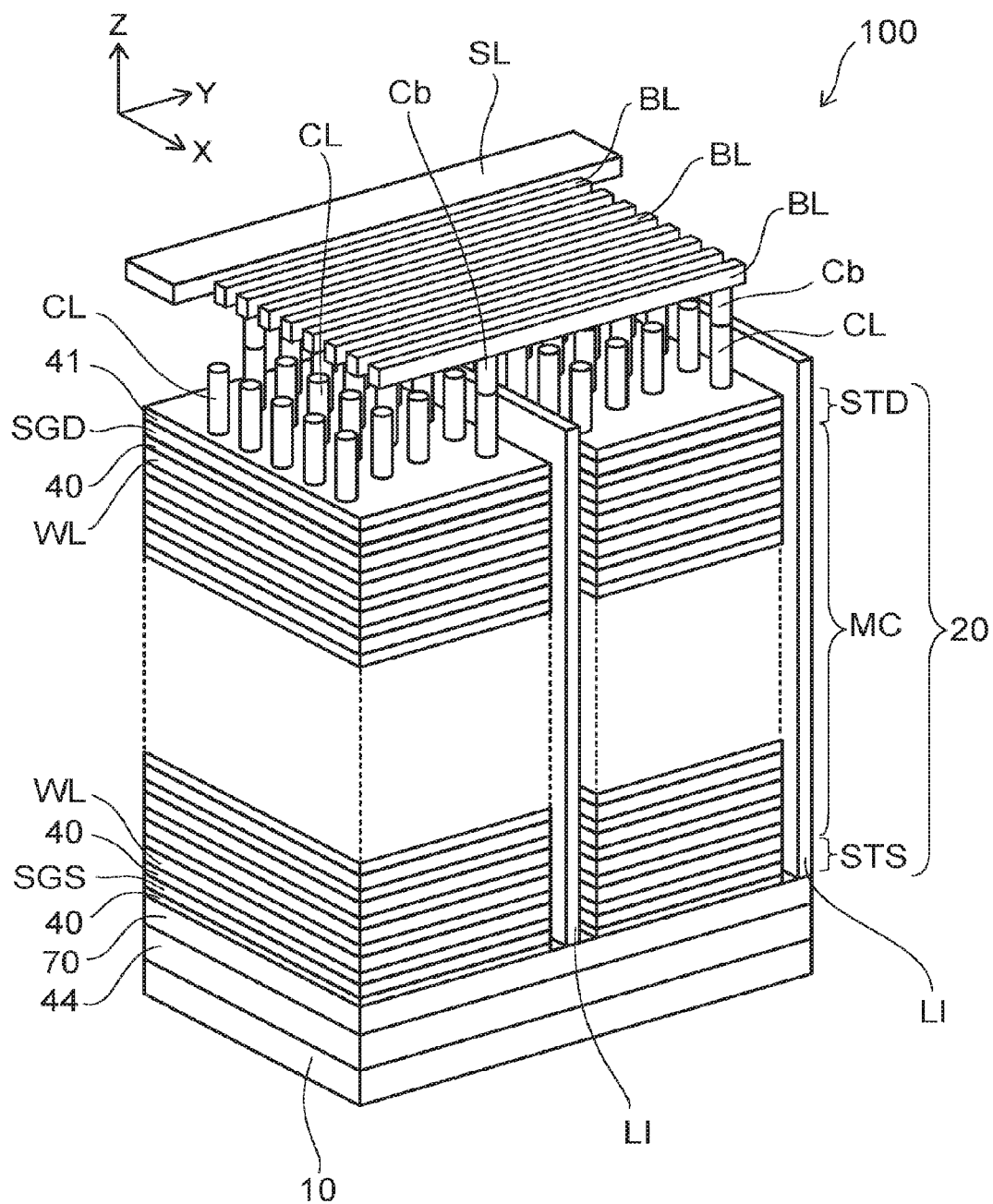
FIG. 22 is a schematic perspective view of a semiconductor memory device according to a second embodiment.

FIG. 22 is a schematic perspective view of a semiconductor memory device according to a second embodiment.

Figure 23:
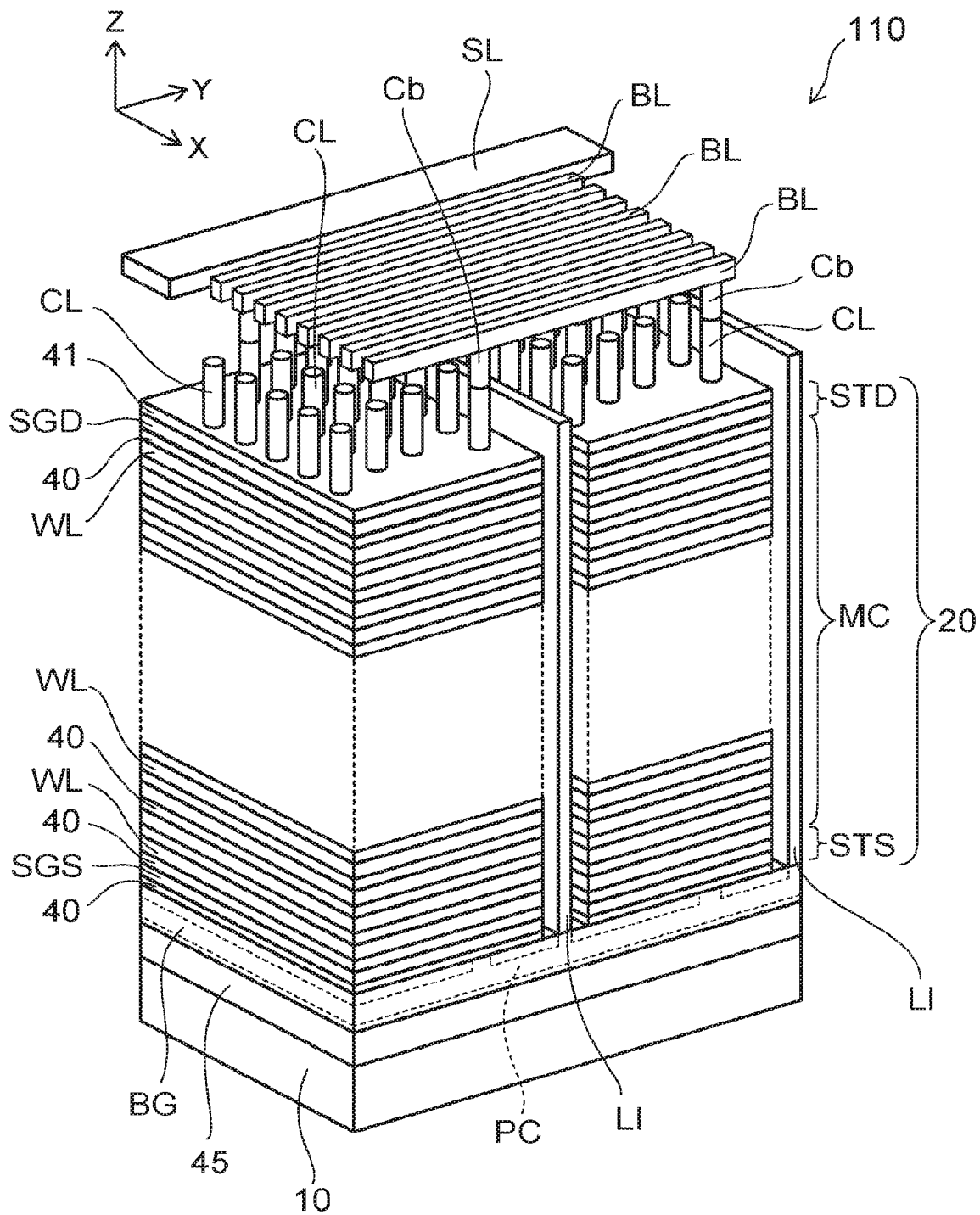
FIG. 23 is a schematic perspective view of another semiconductor memory device according to the second embodiment.

FIG. 23 is a schematic perspective view of another semiconductor memory device according to the second embodiment.

FIG. 22 and FIG. 23 are perspectives corresponding to FIG. 1, showing semiconductor memory devices 100 and 110, respectively, according to the variations.

As shown in FIG. 22, the semiconductor memory device 100 further includes a conductive layer 70 and an insulating layer 44 compared with the semiconductor memory device 1. The insulating layer 44 is provided on the substrate 10. In the insulating layer 44, circuit elements such as an interconnect layer and a transistor (not shown) are provided. The conductive layer 70 is provided on the insulating layer 44. The insulating layer 40 is provided on the conductive layer 70. Configurations on the upper side of the insulating layer 40 are similar to, for example, those of the semiconductor memory device 1. The interconnect portion LI is electrically connected with the columnar portion CL via the conductive layer 70.

As shown in FIG. 23, the semiconductor memory device 110 is provided with a back gate BG on the substrate 10 with an insulating layer 45 between the substrate 10 and the back gate BG, compared with the semiconductor memory device 1. The source-side select gate SGS is provided on the back gate BG with the insulating layer 40 between the back gate BG and the source-side select gate SGS.

The columnar portion CL includes, for example, the core insulating film 30, the semiconductor film 31, and the memory film 32 similarly to the first embodiment. The interconnect portion LI extends in the X-direction and the Z-direction, and a lower surface of the interconnect portion LI is electrically connected with the columnar portion CL via a connecting portion PC provided in the back gate BG.

The connecting portion PC is provided integrally with the columnar portions CL, and extends in the X-direction and the Y-direction in the back gate BG. The connecting portion PC is provided integrally with, for example, the plurality of columnar portions CL. Noted that the phrase "provided integrally with" shows that a portion of the material used for the columnar portion CL extends up to the connecting portion PC. Hence, a portion of the connecting portion PC is provided with the core insulating film 30, the semiconductor film 31, and the memory film 32 similarly to the columnar portion CL.

According to the embodiments described above, it is possible to realize a semiconductor memory device capable of inhibiting a short circuit even when the semiconductor memory device is shrunk, and a method for manufacturing the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor memory device, comprising:
 alternately stacking, on a substrate, an insulating layer and a first layer to form a stacked body;
 forming, in the stacked body, a through-hole extending in a stacking direction of the stacked body;

forming, in the through-hole, a columnar portion including a memory film and a semiconductor film;
forming a first insulating layer on the stacked body and the columnar portion;
forming, in the stacked body and the first insulating layer, a trench extending in the stacking direction and a first direction crossing the stacking direction;
removing the first layer through the trench;
forming a conductive layer in a cavity resulting from the removal of the first layer through the trench;
forming a first insulating film in the trench;
forming a conductive film on the first insulating film in the trench;
removing a portion of the first insulating layer, a portion of the first insulating film, and a portion of the conductive film to form a plate-like interconnect portion including a protruding portion whose width in cross-section decreases with increased distance from the substrate;
forming a second insulating film on a side surface of the protruding portion; and
forming a third insulating film including a first portion provided on an upper surface of the interconnect portion, a second portion provided on the second insulating film, and a third portion extending in a second direction crossing the stacking direction and the first direction.

2. The method according to claim 1, wherein
the first insulating film and the second insulating film are films containing silicon oxide, and
the third insulating film is a film containing silicon nitride.

3. The method according to claim 1, comprising:
forming a second insulating layer on the first insulating layer;
removing a portion of the second insulating layer to form a contact hole; and
burying a conductor in the contact hole to form a first contact portion connecting with the semiconductor film.

4. The method according to claim 3, wherein
the third portion protrudes toward the first contact portion.

5. The method according to claim 3, wherein
the third insulating film is located in the second insulating layer.

6. The method according to claim 3, further comprising removing a portion of the first portion to form a second contact portion connecting with the interconnect portion.

7. The method according to claim 6, further comprising:
forming a first interconnect connecting with the first contact portion; and
forming a second interconnect connecting with the second contact portion.

8. A semiconductor memory device comprising:
a substrate;
a stacked body provided on the substrate and including a plurality of electrode layers separately stacked each other;
a semiconductor film extending in a stacking direction in the stacked body;
a memory film provided between the semiconductor film and one of the plurality of electrode layers;
a plate-like interconnect portion provided in the stacked body and extending in the stacking direction and a first direction crossing the stacking direction; and
a first insulating film and a second insulating film provided on the interconnect portion,
the interconnect portion including a first interconnect portion provided on the substrate and a second interconnect portion whose width in cross-section decreases with increased distance from the substrate,
the first insulating film being provided on a side surface of the first interconnect portion and a side surface of the second interconnect portion,
the second insulating film including a first portion, a second portion, and a third portion, the first portion being provided on an upper surface of the interconnect portion, the first insulating film being provided between the second portion and the side surface of the second interconnect portion, the third portion extending in a second direction crossing the stacking direction and the first direction.

9. The device according to claim 8, wherein
the first insulating film is a film containing silicon oxide, and
the second insulating film is a film containing silicon nitride.

10. The device according to claim 8, further comprising a first contact portion connecting with the semiconductor film, wherein
the third portion protrudes toward the first contact portion.

11. The device according to claim 8, wherein
a distance in the stacking direction between the third portion and the stacked body is shorter than a distance in the stacking direction between the first portion and the stacked body,
the distance in the stacking direction between the third portion and the stacked body is shorter than a distance in the stacking direction between the second portion and the stacked body, and
the distance in the stacking direction between the second portion and the stacked body is shorter than the distance in the stacking direction between the first portion and the stacked body.

12. The device according to claim 8, further comprising:
a first contact portion connecting with the semiconductor film; and
an insulating layer provided on the stacked body, wherein
the second insulating film and the first contact portion are provided in the insulating layer.

13. The device according to claim 8, wherein
the first interconnect portion is provided such that a width in cross-section of the first interconnect portion increases with increased distance from the substrate, and
the second interconnect portion is provided on the first interconnect portion.

14. The device according to claim 8, further comprising:
a first contact portion connecting with the semiconductor film;
a second contact portion connecting with the interconnect portion;
a first interconnect connected to the first contact portion; and
a second interconnect connected to the second contact portion.

* * * * *